(12) United States Patent
Chua et al.

(10) Patent No.: US 10,549,561 B2
(45) Date of Patent: Feb. 4, 2020

(54) APPARATUS FOR SEALING AN ENCLOSURE

(71) Applicant: Datamax-O'Neil Corporation, Orlando, FL (US)

(72) Inventors: Ching Hong Chua, Singapore (SG); Guy Heaton, Mission Viejo, CA (US); Eng Hing Lim, Singapore (SG)

(73) Assignee: DATAMAX-O'NEIL CORPORATION, Orlando, FL (US)

( * ) Notice: Subject to any disclaimer, the term of this patent is extended or adjusted under 35 U.S.C. 154(b) by 82 days.

(21) Appl. No.: 15/586,450

(22) Filed: May 4, 2017

(65) Prior Publication Data

US 2018/0319184 A1    Nov. 8, 2018

(51) Int. Cl.
*B41J 29/13* (2006.01)
*H05K 5/06* (2006.01)

(52) U.S. Cl.
CPC .............. *B41J 29/13* (2013.01); *H05K 5/061* (2013.01)

(58) Field of Classification Search
CPC ... B41J 15/042; B41J 29/00; B41J 2/32; B41J 3/36; B41J 15/04; B41J 29/13; B41J 2202/11; B41J 3/39; H05K 5/061; H05K 5/069; H05K 3/361
See application file for complete search history.

(56) References Cited

U.S. PATENT DOCUMENTS

| | | | |
|---|---|---|---|
| 6,832,725 B2 | 12/2004 | Gardiner et al. | |
| 7,128,266 B2 | 10/2006 | Zhu et al. | |
| 7,159,783 B2 | 1/2007 | Walczyk et al. | |
| 7,413,127 B2 | 8/2008 | Ehrhart et al. | |
| 7,726,575 B2 | 6/2010 | Wang et al. | |
| 8,136,279 B1 | 3/2012 | Nearman et al. | |
| 8,294,969 B2 | 10/2012 | Plesko | |
| 8,317,105 B2 | 11/2012 | Kotlarsky et al. | |
| 8,322,622 B2 | 12/2012 | Liu | |
| 8,366,005 B2 | 2/2013 | Kotlarsky et al. | |
| 8,371,507 B2 | 2/2013 | Haggerty et al. | |
| 8,376,233 B2 | 2/2013 | Van Horn et al. | |
| 8,381,979 B2 | 2/2013 | Franz | |

(Continued)

FOREIGN PATENT DOCUMENTS

| WO | 2013163789 A1 | 11/2013 |
|---|---|---|
| WO | 2013173985 A1 | 11/2013 |

(Continued)

OTHER PUBLICATIONS

U.S. Appl. No. 14/715,916 for Evaluating Image Values filed May 19, 2015 (Ackley); 60 pages.

(Continued)

*Primary Examiner* — Jannelle M Lebron
(74) *Attorney, Agent, or Firm* — Alston & Bird LLP

(57) ABSTRACT

Sealing assemblies for preventing water intrusion into the interior of a casing are provided. In one exemplary implementation, a water-resistant casing comprises a sealing element over-molded on a wall, wherein the sealing element includes a first feature and a second feature. The water-resistant casing includes a top section constrained in a lower position by the first feature of the sealing element. The water-resistant casing further includes a bottom section constrained in an upper position by the second feature of the sealing element.

20 Claims, 4 Drawing Sheets

(56) References Cited

U.S. PATENT DOCUMENTS

| | | |
|---|---|---|
| 8,390,909 B2 | 3/2013 | Plesko |
| 8,408,464 B2 | 4/2013 | Zhu et al. |
| 8,408,468 B2 | 4/2013 | Horn et al. |
| 8,408,469 B2 | 4/2013 | Good |
| 8,424,768 B2 | 4/2013 | Rueblinger et al. |
| 8,448,863 B2 | 5/2013 | Xian et al. |
| 8,457,013 B2 | 6/2013 | Essinger et al. |
| 8,459,557 B2 | 6/2013 | Havens et al. |
| 8,469,272 B2 | 6/2013 | Kearney |
| 8,474,712 B2 | 7/2013 | Kearney et al. |
| 8,479,992 B2 | 7/2013 | Kotlarsky et al. |
| 8,490,877 B2 | 7/2013 | Kearney |
| 8,517,271 B2 | 8/2013 | Kotlarsky et al. |
| 8,523,076 B2 | 9/2013 | Good |
| 8,528,818 B2 | 9/2013 | Ehrhart et al. |
| 8,544,737 B2 | 10/2013 | Gomez et al. |
| 8,548,420 B2 | 10/2013 | Grunow et al. |
| 8,550,335 B2 | 10/2013 | Samek et al. |
| 8,550,354 B2 | 10/2013 | Gannon et al. |
| 8,550,357 B2 | 10/2013 | Kearney |
| 8,556,174 B2 | 10/2013 | Kosecki et al. |
| 8,556,176 B2 | 10/2013 | Van Horn et al. |
| 8,556,177 B2 | 10/2013 | Hussey et al. |
| 8,559,767 B2 | 10/2013 | Barber et al. |
| 8,561,895 B2 | 10/2013 | Gomez et al. |
| 8,561,903 B2 | 10/2013 | Sauerwein |
| 8,561,905 B2 | 10/2013 | Edmonds et al. |
| 8,565,107 B2 | 10/2013 | Pease et al. |
| 8,571,307 B2 | 10/2013 | Li et al. |
| 8,579,200 B2 | 11/2013 | Samek et al. |
| 8,583,924 B2 | 11/2013 | Caballero et al. |
| 8,584,945 B2 | 11/2013 | Wang et al. |
| 8,587,595 B2 | 11/2013 | Wang |
| 8,587,697 B2 | 11/2013 | Hussey et al. |
| 8,588,869 B2 | 11/2013 | Sauerwein et al. |
| 8,590,789 B2 | 11/2013 | Nahill et al. |
| 8,596,539 B2 | 12/2013 | Havens et al. |
| 8,596,542 B2 | 12/2013 | Havens et al. |
| 8,596,543 B2 | 12/2013 | Havens et al. |
| 8,599,271 B2 | 12/2013 | Havens et al. |
| 8,599,957 B2 | 12/2013 | Peake et al. |
| 8,600,158 B2 | 12/2013 | Li et al. |
| 8,600,167 B2 | 12/2013 | Showering |
| 8,602,309 B2 | 12/2013 | Longacre et al. |
| 8,608,053 B2 | 12/2013 | Meier et al. |
| 8,608,071 B2 | 12/2013 | Liu et al. |
| 8,611,309 B2 | 12/2013 | Wang et al. |
| 8,615,487 B2 | 12/2013 | Gomez et al. |
| 8,621,123 B2 | 12/2013 | Caballero |
| 8,622,303 B2 | 1/2014 | Meier et al. |
| 8,628,013 B2 | 1/2014 | Ding |
| 8,628,015 B2 | 1/2014 | Wang et al. |
| 8,628,016 B2 | 1/2014 | Winegar |
| 8,629,926 B2 | 1/2014 | Wang |
| 8,630,491 B2 | 1/2014 | Longacre et al. |
| 8,635,309 B2 | 1/2014 | Berthiaume et al. |
| 8,636,200 B2 | 1/2014 | Kearney |
| 8,636,212 B2 | 1/2014 | Nahill et al. |
| 8,636,215 B2 | 1/2014 | Ding et al. |
| 8,636,224 B2 | 1/2014 | Wang |
| 8,638,806 B2 | 1/2014 | Wang et al. |
| 8,640,958 B2 | 2/2014 | Lu et al. |
| 8,640,960 B2 | 2/2014 | Wang et al. |
| 8,643,717 B2 | 2/2014 | Li et al. |
| 8,646,692 B2 | 2/2014 | Meier et al. |
| 8,646,694 B2 | 2/2014 | Wang et al. |
| 8,657,200 B2 | 2/2014 | Ren et al. |
| 8,659,397 B2 | 2/2014 | Vargo et al. |
| 8,668,149 B2 | 3/2014 | Good |
| 8,678,285 B2 | 3/2014 | Kearney |
| 8,678,286 B2 | 3/2014 | Smith et al. |
| 8,682,077 B1 | 3/2014 | Longacre |
| D702,237 S | 4/2014 | Oberpriller et al. |
| 8,687,282 B2 | 4/2014 | Feng et al. |
| 8,692,927 B2 | 4/2014 | Pease et al. |
| 8,695,880 B2 | 4/2014 | Bremer et al. |
| 8,698,949 B2 | 4/2014 | Grunow et al. |
| 8,702,000 B2 | 4/2014 | Barber et al. |
| 8,717,494 B2 | 5/2014 | Gannon |
| 8,720,783 B2 | 5/2014 | Biss et al. |
| 8,723,804 B2 | 5/2014 | Fletcher et al. |
| 8,723,904 B2 | 5/2014 | Marty et al. |
| 8,727,223 B2 | 5/2014 | Wang |
| 8,740,082 B2 | 6/2014 | Wilz |
| 8,740,085 B2 | 6/2014 | Furlong et al. |
| 8,746,563 B2 | 6/2014 | Hennick et al. |
| 8,750,445 B2 | 6/2014 | Peake et al. |
| 8,752,766 B2 | 6/2014 | Xian et al. |
| 8,756,059 B2 | 6/2014 | Braho et al. |
| 8,757,495 B2 | 6/2014 | Qu et al. |
| 8,760,563 B2 | 6/2014 | Koziol et al. |
| 8,763,909 B2 | 7/2014 | Reed et al. |
| 8,777,108 B2 | 7/2014 | Coyle |
| 8,777,109 B2 | 7/2014 | Oberpriller et al. |
| 8,779,898 B2 | 7/2014 | Havens et al. |
| 8,781,520 B2 | 7/2014 | Payne et al. |
| 8,783,573 B2 | 7/2014 | Havens et al. |
| 8,789,757 B2 | 7/2014 | Barten |
| 8,789,758 B2 | 7/2014 | Hawley et al. |
| 8,789,759 B2 | 7/2014 | Xian et al. |
| 8,794,520 B2 | 8/2014 | Wang et al. |
| 8,794,522 B2 | 8/2014 | Ehrhart |
| 8,794,525 B2 | 8/2014 | Amundsen et al. |
| 8,794,526 B2 | 8/2014 | Wang et al. |
| 8,798,367 B2 | 8/2014 | Ellis |
| 8,807,431 B2 | 8/2014 | Wang et al. |
| 8,807,432 B2 | 8/2014 | Van Horn et al. |
| 8,820,630 B2 | 9/2014 | Qu et al. |
| 8,822,848 B2 | 9/2014 | Meagher |
| 8,824,692 B2 | 9/2014 | Sheerin et al. |
| 8,824,696 B2 | 9/2014 | Braho |
| 8,842,849 B2 | 9/2014 | Wahl et al. |
| 8,844,822 B2 | 9/2014 | Kotlarsky et al. |
| 8,844,823 B2 | 9/2014 | Fritz et al. |
| 8,849,019 B2 | 9/2014 | Li et al. |
| D716,285 S | 10/2014 | Chaney et al. |
| 8,851,383 B2 | 10/2014 | Yeakley et al. |
| 8,854,633 B2 | 10/2014 | Laffargue |
| 8,866,963 B2 | 10/2014 | Grunow et al. |
| 8,868,421 B2 | 10/2014 | Braho et al. |
| 8,868,519 B2 | 10/2014 | Maloy et al. |
| 8,868,802 B2 | 10/2014 | Barten |
| 8,868,803 B2 | 10/2014 | Caballero |
| 8,870,074 B1 | 10/2014 | Gannon |
| 8,879,639 B2 | 11/2014 | Sauerwein |
| 8,880,426 B2 | 11/2014 | Smith |
| 8,881,983 B2 | 11/2014 | Havens et al. |
| 8,881,987 B2 | 11/2014 | Wang |
| 8,903,172 B2 | 12/2014 | Smith |
| 8,908,995 B2 | 12/2014 | Benos et al. |
| 8,910,870 B2 | 12/2014 | Li et al. |
| 8,910,875 B2 | 12/2014 | Ren et al. |
| 8,914,290 B2 | 12/2014 | Hendrickson et al. |
| 8,914,788 B2 | 12/2014 | Pettinelli et al. |
| 8,915,439 B2 | 12/2014 | Feng et al. |
| 8,915,444 B2 | 12/2014 | Havens et al. |
| 8,916,789 B2 | 12/2014 | Woodburn |
| 8,918,250 B2 | 12/2014 | Hollifield |
| 8,918,564 B2 | 12/2014 | Caballero |
| 8,925,818 B2 | 1/2015 | Kosecki et al. |
| 8,939,374 B2 | 1/2015 | Jovanovski et al. |
| 8,942,480 B2 | 1/2015 | Ellis |
| 8,944,313 B2 | 2/2015 | Williams et al. |
| 8,944,327 B2 | 2/2015 | Meier et al. |
| 8,944,332 B2 | 2/2015 | Harding et al. |
| 8,950,678 B2 | 2/2015 | Germaine et al. |
| D723,560 S | 3/2015 | Zhou et al. |
| 8,967,468 B2 | 3/2015 | Gomez et al. |
| 8,971,346 B2 | 3/2015 | Sevier |
| 8,976,030 B2 | 3/2015 | Cunningham et al. |
| 8,976,368 B2 | 3/2015 | Akel et al. |
| 8,978,981 B2 | 3/2015 | Guan |
| 8,978,983 B2 | 3/2015 | Bremer et al. |
| 8,978,984 B2 | 3/2015 | Hennick et al. |

(56) References Cited

U.S. PATENT DOCUMENTS

| | | |
|---|---|---|
| 8,985,456 B2 | 3/2015 | Zhu et al. |
| 8,985,457 B2 | 3/2015 | Soule et al. |
| 8,985,459 B2 | 3/2015 | Kearney et al. |
| 8,985,461 B2 | 3/2015 | Gelay et al. |
| 8,988,578 B2 | 3/2015 | Showering |
| 8,988,590 B2 | 3/2015 | Gillet et al. |
| 8,991,704 B2 | 3/2015 | Hopper et al. |
| 8,996,194 B2 | 3/2015 | Davis et al. |
| 8,996,384 B2 | 3/2015 | Funyak et al. |
| 8,998,091 B2 | 4/2015 | Edmonds et al. |
| 9,002,641 B2 | 4/2015 | Showering |
| 9,007,368 B2 | 4/2015 | Laffargue et al. |
| 9,010,641 B2 | 4/2015 | Qu et al. |
| 9,015,513 B2 | 4/2015 | Murawski et al. |
| 9,016,576 B2 | 4/2015 | Brady et al. |
| D730,357 S | 5/2015 | Fitch et al. |
| 9,022,288 B2 | 5/2015 | Nahill et al. |
| 9,030,964 B2 | 5/2015 | Essinger et al. |
| 9,033,240 B2 | 5/2015 | Smith et al. |
| 9,033,242 B2 | 5/2015 | Gillet et al. |
| 9,036,054 B2 | 5/2015 | Koziol et al. |
| 9,037,344 B2 | 5/2015 | Chamberlin |
| 9,038,911 B2 | 5/2015 | Xian et al. |
| 9,038,915 B2 | 5/2015 | Smith |
| D730,901 S | 6/2015 | Oberpriller et al. |
| D730,902 S | 6/2015 | Fitch et al. |
| D733,112 S | 6/2015 | Chaney et al. |
| 9,047,098 B2 | 6/2015 | Barten |
| 9,047,359 B2 | 6/2015 | Caballero et al. |
| 9,047,420 B2 | 6/2015 | Caballero |
| 9,047,525 B2 | 6/2015 | Barber |
| 9,047,531 B2 | 6/2015 | Showering et al. |
| 9,049,640 B2 | 6/2015 | Wang et al. |
| 9,053,055 B2 | 6/2015 | Caballero |
| 9,053,378 B1 | 6/2015 | Hou et al. |
| 9,053,380 B2 | 6/2015 | Xian et al. |
| 9,057,641 B2 | 6/2015 | Amundsen et al. |
| 9,058,526 B2 | 6/2015 | Powilleit |
| 9,064,165 B2 | 6/2015 | Havens et al. |
| 9,064,167 B2 | 6/2015 | Xian et al. |
| 9,064,168 B2 | 6/2015 | Todeschini et al. |
| 9,064,254 B2 | 6/2015 | Todeschini et al. |
| 9,066,032 B2 | 6/2015 | Wang |
| 9,070,032 B2 | 6/2015 | Corcoran |
| D734,339 S | 7/2015 | Zhou et al. |
| D734,751 S | 7/2015 | Oberpriller et al. |
| 9,082,023 B2 | 7/2015 | Feng et al. |
| 9,224,022 B2 | 12/2015 | Ackley et al. |
| 9,224,027 B2 | 12/2015 | Van Horn et al. |
| D747,321 S | 1/2016 | London et al. |
| 9,230,140 B1 | 1/2016 | Ackley |
| 9,443,123 B2 | 1/2016 | Hejl |
| 9,250,712 B1 | 2/2016 | Todeschini |
| 9,258,033 B2 | 2/2016 | Showering |
| 9,262,633 B1 | 2/2016 | Todeschini et al. |
| 9,310,609 B2 | 4/2016 | Rueblinger et al. |
| D757,009 S | 5/2016 | Oberpriller et al. |
| 9,342,724 B2 | 5/2016 | McCloskey |
| 9,375,945 B1 | 6/2016 | Bowles |
| D760,719 S | 7/2016 | Zhou et al. |
| 9,390,596 B1 | 7/2016 | Todeschini |
| D762,604 S | 8/2016 | Fitch et al. |
| D762,647 S | 8/2016 | Fitch et al. |
| 9,412,242 B2 | 8/2016 | Van Horn et al. |
| D766,244 S | 9/2016 | Zhou et al. |
| 9,443,222 B2 | 9/2016 | Singel et al. |
| 9,444,506 B2 | 9/2016 | Lai et al. |
| 9,478,113 B2 | 10/2016 | Xie et al. |
| 2007/0063048 A1 | 3/2007 | Havens et al. |
| 2009/0134221 A1 | 5/2009 | Zhu et al. |
| 2010/0177076 A1 | 7/2010 | Essinger et al. |
| 2010/0177080 A1 | 7/2010 | Essinger et al. |
| 2010/0177707 A1 | 7/2010 | Essinger et al. |
| 2010/0177749 A1 | 7/2010 | Essinger et al. |
| 2011/0169999 A1 | 7/2011 | Grunow et al. |
| 2011/0202554 A1 | 8/2011 | Powilleit et al. |
| 2012/0111946 A1 | 5/2012 | Golant |
| 2012/0155946 A1* | 6/2012 | Colonel ............... B41J 11/0025 400/691 |
| 2012/0168512 A1 | 7/2012 | Kotlarsky et al. |
| 2012/0193423 A1 | 8/2012 | Samek |
| 2012/0203647 A1 | 8/2012 | Smith |
| 2012/0223141 A1 | 9/2012 | Good et al. |
| 2013/0043312 A1 | 2/2013 | Van Horn |
| 2013/0075168 A1 | 3/2013 | Amundsen et al. |
| 2013/0175341 A1 | 7/2013 | Kearney et al. |
| 2013/0175343 A1 | 7/2013 | Good |
| 2013/0257744 A1 | 10/2013 | Daghigh et al. |
| 2013/0257759 A1 | 10/2013 | Daghigh |
| 2013/0270346 A1 | 10/2013 | Xian et al. |
| 2013/0287258 A1 | 10/2013 | Kearney |
| 2013/0292475 A1 | 11/2013 | Kotlarsky et al. |
| 2013/0292477 A1 | 11/2013 | Hennick et al. |
| 2013/0293539 A1 | 11/2013 | Hunt et al. |
| 2013/0293540 A1 | 11/2013 | Laffargue et al. |
| 2013/0306728 A1 | 11/2013 | Thuries et al. |
| 2013/0306731 A1 | 11/2013 | Pedraro |
| 2013/0307964 A1 | 11/2013 | Bremer et al. |
| 2013/0308625 A1 | 11/2013 | Park et al. |
| 2013/0313324 A1 | 11/2013 | Koziol et al. |
| 2013/0313325 A1 | 11/2013 | Wilz et al. |
| 2013/0342717 A1 | 12/2013 | Havens et al. |
| 2014/0001267 A1 | 1/2014 | Giordano et al. |
| 2014/0002828 A1 | 1/2014 | Laffargue et al. |
| 2014/0008439 A1 | 1/2014 | Wang |
| 2014/0025584 A1 | 1/2014 | Liu et al. |
| 2014/0100813 A1 | 1/2014 | Showering |
| 2014/0034734 A1 | 2/2014 | Sauerwein |
| 2014/0036848 A1 | 2/2014 | Pease et al. |
| 2014/0039693 A1 | 2/2014 | Havens et al. |
| 2014/0042814 A1 | 2/2014 | Kather et al. |
| 2014/0049120 A1 | 2/2014 | Kohtz et al. |
| 2014/0049635 A1 | 2/2014 | Laffargue et al. |
| 2014/0061306 A1 | 3/2014 | Wu et al. |
| 2014/0063289 A1 | 3/2014 | Hussey et al. |
| 2014/0066136 A1 | 3/2014 | Sauerwein et al. |
| 2014/0067692 A1 | 3/2014 | Ye et al. |
| 2014/0070005 A1 | 3/2014 | Nahill et al. |
| 2014/0071840 A1 | 3/2014 | Venancio |
| 2014/0074746 A1 | 3/2014 | Wang |
| 2014/0076974 A1 | 3/2014 | Havens et al. |
| 2014/0078341 A1 | 3/2014 | Havens et al. |
| 2014/0078342 A1 | 3/2014 | Li et al. |
| 2014/0078345 A1 | 3/2014 | Showering |
| 2014/0098792 A1 | 4/2014 | Wang et al. |
| 2014/0100774 A1 | 4/2014 | Showering |
| 2014/0103115 A1 | 4/2014 | Meier et al. |
| 2014/0104413 A1 | 4/2014 | McCloskey et al. |
| 2014/0104414 A1 | 4/2014 | McCloskey et al. |
| 2014/0104416 A1 | 4/2014 | Giordano et al. |
| 2014/0104451 A1 | 4/2014 | Todeschini et al. |
| 2014/0106594 A1 | 4/2014 | Skvoretz |
| 2014/0106725 A1 | 4/2014 | Sauerwein |
| 2014/0108010 A1 | 4/2014 | Maltseff et al. |
| 2014/0108402 A1 | 4/2014 | Gomez et al. |
| 2014/0108682 A1 | 4/2014 | Caballero |
| 2014/0110485 A1 | 4/2014 | Toa et al. |
| 2014/0114530 A1 | 4/2014 | Fitch et al. |
| 2014/0124577 A1 | 5/2014 | Wang et al. |
| 2014/0124579 A1 | 5/2014 | Ding |
| 2014/0125842 A1 | 5/2014 | Winegar |
| 2014/0125853 A1 | 5/2014 | Wang |
| 2014/0125999 A1 | 5/2014 | Longacre et al. |
| 2014/0129378 A1 | 5/2014 | Richardson |
| 2014/0131438 A1 | 5/2014 | Kearney |
| 2014/0131441 A1 | 5/2014 | Nahill et al. |
| 2014/0131443 A1 | 5/2014 | Smith |
| 2014/0131444 A1 | 5/2014 | Wang |
| 2014/0131445 A1 | 5/2014 | Ding et al. |
| 2014/0131448 A1 | 5/2014 | Xian et al. |
| 2014/0133379 A1 | 5/2014 | Wang et al. |
| 2014/0136208 A1 | 5/2014 | Maltseff et al. |
| 2014/0140585 A1 | 5/2014 | Wang |
| 2014/0151453 A1 | 6/2014 | Meier et al. |

(56) References Cited

U.S. PATENT DOCUMENTS

| | | |
|---|---|---|
| 2014/0152882 A1 | 6/2014 | Samek et al. |
| 2014/0158770 A1 | 6/2014 | Sevier et al. |
| 2014/0159869 A1 | 6/2014 | Zumsteg et al. |
| 2014/0166755 A1 | 6/2014 | Liu et al. |
| 2014/0166757 A1 | 6/2014 | Smith |
| 2014/0166759 A1 | 6/2014 | Liu et al. |
| 2014/0168787 A1 | 6/2014 | Wang et al. |
| 2014/0175165 A1 | 6/2014 | Havens et al. |
| 2014/0175172 A1 | 6/2014 | Jovanovski et al. |
| 2014/0191644 A1 | 7/2014 | Chaney |
| 2014/0191913 A1 | 7/2014 | Ge et al. |
| 2014/0197238 A1 | 7/2014 | Lui et al. |
| 2014/0197239 A1 | 7/2014 | Havens et al. |
| 2014/0197304 A1 | 7/2014 | Feng et al. |
| 2014/0203087 A1 | 7/2014 | Smith et al. |
| 2014/0204268 A1 | 7/2014 | Grunow et al. |
| 2014/0214631 A1 | 7/2014 | Hansen |
| 2014/0217166 A1 | 8/2014 | Berthiaume et al. |
| 2014/0217180 A1 | 8/2014 | Liu |
| 2014/0231500 A1 | 8/2014 | Ehrhart et al. |
| 2014/0232930 A1 | 8/2014 | Anderson |
| 2014/0247315 A1 | 9/2014 | Marty et al. |
| 2014/0263493 A1 | 9/2014 | Amurgis et al. |
| 2014/0263645 A1 | 9/2014 | Smith et al. |
| 2014/0268519 A1 | 9/2014 | Huang et al. |
| 2014/0270196 A1 | 9/2014 | Braho et al. |
| 2014/0270229 A1 | 9/2014 | Braho |
| 2014/0278387 A1 | 9/2014 | DiGregorio |
| 2014/0282210 A1 | 9/2014 | Bianconi |
| 2014/0284384 A1 | 9/2014 | Lu et al. |
| 2014/0288933 A1 | 9/2014 | Braho et al. |
| 2014/0297058 A1 | 10/2014 | Barker et al. |
| 2014/0299665 A1 | 10/2014 | Barber et al. |
| 2014/0312121 A1 | 10/2014 | Lu et al. |
| 2014/0319220 A1 | 10/2014 | Coyle |
| 2014/0319221 A1 | 10/2014 | Oberpriller et al. |
| 2014/0326787 A1 | 11/2014 | Barten |
| 2014/0332590 A1 | 11/2014 | Wang et al. |
| 2014/0344943 A1 | 11/2014 | Todeschini et al. |
| 2014/0346233 A1 | 11/2014 | Liu et al. |
| 2014/0351317 A1 | 11/2014 | Smith et al. |
| 2014/0353373 A1 | 12/2014 | Van Horn et al. |
| 2014/0361073 A1 | 12/2014 | Qu et al. |
| 2014/0361082 A1 | 12/2014 | Xian et al. |
| 2014/0362184 A1 | 12/2014 | Jovanovski et al. |
| 2014/0363015 A1 | 12/2014 | Braho |
| 2014/0369511 A1 | 12/2014 | Sheerin et al. |
| 2014/0374483 A1 | 12/2014 | Lu |
| 2014/0374485 A1 | 12/2014 | Xian et al. |
| 2015/0001301 A1 | 1/2015 | Ouyang |
| 2015/0001304 A1 | 1/2015 | Todeschini |
| 2015/0003673 A1 | 1/2015 | Fletcher |
| 2015/0009338 A1 | 1/2015 | Laffargue et al. |
| 2015/0009610 A1 | 1/2015 | London et al. |
| 2015/0014416 A1 | 1/2015 | Kotlarsky et al. |
| 2015/0021397 A1 | 1/2015 | Rueblinger et al. |
| 2015/0028102 A1 | 1/2015 | Ren et al. |
| 2015/0028103 A1 | 1/2015 | Jiang |
| 2015/0028104 A1 | 1/2015 | Ma et al. |
| 2015/0029002 A1 | 1/2015 | Yeakley et al. |
| 2015/0032709 A1 | 1/2015 | Maloy et al. |
| 2015/0039309 A1 | 2/2015 | Braho et al. |
| 2015/0040378 A1 | 2/2015 | Saber et al. |
| 2015/0048168 A1 | 2/2015 | Fritz et al. |
| 2015/0049347 A1 | 2/2015 | Laffargue et al. |
| 2015/0051992 A1 | 2/2015 | Smith |
| 2015/0053766 A1 | 2/2015 | Havens et al. |
| 2015/0053768 A1 | 2/2015 | Wang et al. |
| 2015/0053769 A1 | 2/2015 | Thuries et al. |
| 2015/0062366 A1 | 3/2015 | Liu et al. |
| 2015/0063215 A1 | 3/2015 | Wang |
| 2015/0063676 A1 | 3/2015 | Lloyd et al. |
| 2015/0069130 A1 | 3/2015 | Gannon |
| 2015/0071819 A1 | 3/2015 | Todeschini |
| 2015/0083800 A1 | 3/2015 | Li et al. |
| 2015/0086114 A1 | 3/2015 | Todeschini |
| 2015/0088522 A1 | 3/2015 | Hendrickson et al. |
| 2015/0096872 A1 | 4/2015 | Woodburn |
| 2015/0099557 A1 | 4/2015 | Pettinelli et al. |
| 2015/0100196 A1 | 4/2015 | Hollifield |
| 2015/0102109 A1 | 4/2015 | Huck |
| 2015/0115035 A1 | 4/2015 | Meier et al. |
| 2015/0127791 A1 | 5/2015 | Kosecki et al. |
| 2015/0128116 A1 | 5/2015 | Chen et al. |
| 2015/0129659 A1 | 5/2015 | Feng et al. |
| 2015/0133047 A1 | 5/2015 | Smith et al. |
| 2015/0134470 A1 | 5/2015 | Hejl et al. |
| 2015/0136851 A1 | 5/2015 | Harding et al. |
| 2015/0136854 A1 | 5/2015 | Lu et al. |
| 2015/0142492 A1 | 5/2015 | Kumar |
| 2015/0144692 A1 | 5/2015 | Hejl |
| 2015/0144698 A1 | 5/2015 | Teng et al. |
| 2015/0144701 A1 | 5/2015 | Xian et al. |
| 2015/0149946 A1 | 5/2015 | Benos et al. |
| 2015/0161429 A1 | 6/2015 | Xian |
| 2015/0169925 A1 | 6/2015 | Chang et al. |
| 2015/0169929 A1 | 6/2015 | Williams et al. |
| 2015/0186703 A1 | 7/2015 | Chen et al. |
| 2015/0193644 A1 | 7/2015 | Kearney et al. |
| 2015/0193645 A1 | 7/2015 | Colavito et al. |
| 2015/0199957 A1 | 7/2015 | Funyak et al. |
| 2015/0204671 A1 | 7/2015 | Showering |
| 2015/0210199 A1 | 7/2015 | Payne |
| 2015/0220753 A1 | 8/2015 | Zhu et al. |
| 2015/0254485 A1 | 9/2015 | Feng et al. |
| 2015/0327012 A1 | 11/2015 | Bian et al. |
| 2016/0014251 A1 | 1/2016 | Hejl |
| 2016/0040982 A1 | 2/2016 | Li et al. |
| 2016/0042241 A1 | 2/2016 | Todeschini |
| 2016/0057230 A1 | 2/2016 | Todeschini et al. |
| 2016/0109219 A1 | 4/2016 | Ackley et al. |
| 2016/0109220 A1 | 4/2016 | Laffargue |
| 2016/0109224 A1 | 4/2016 | Thuries et al. |
| 2016/0112631 A1 | 4/2016 | Ackley et al. |
| 2016/0112643 A1 | 4/2016 | Laffargue et al. |
| 2016/0124516 A1 | 5/2016 | Schoon et al. |
| 2016/0125217 A1 | 5/2016 | Todeschini |
| 2016/0125342 A1 | 5/2016 | Miller et al. |
| 2016/0133253 A1 | 5/2016 | Braho et al. |
| 2016/0171720 A1 | 6/2016 | Todeschini |
| 2016/0178479 A1 | 6/2016 | Goldsmith |
| 2016/0180678 A1 | 6/2016 | Ackley et al. |
| 2016/0189087 A1 | 6/2016 | Morton et al. |
| 2016/0125873 A1 | 7/2016 | Braho et al. |
| 2016/0227912 A1 | 8/2016 | Oberpriller et al. |
| 2016/0232891 A1 | 8/2016 | Pecorari |
| 2016/0292477 A1 | 10/2016 | Bidwell |
| 2016/0294779 A1 | 10/2016 | Yeakley et al. |
| 2016/0306769 A1 | 10/2016 | Kohtz et al. |
| 2016/0314276 A1 | 10/2016 | Sewell et al. |
| 2016/0314294 A1 | 10/2016 | Kubler et al. |

FOREIGN PATENT DOCUMENTS

| | | |
|---|---|---|
| WO | 2014019130 A1 | 2/2014 |
| WO | 2014110495 A1 | 7/2014 |

OTHER PUBLICATIONS

U.S. Appl. No. 29/525,068 for Tablet Computer With Removable Scanning Device filed Apr. 27, 2015 (Schulte et al.); 19 pages.

U.S. Appl. No. 29/468,118 for an Electronic Device Case, filed Sep. 26, 2013 (Oberpriller et al.); 44 pages.

U.S. Appl. No. 29/530,600 for Cyclone filed Jun. 18, 2015 (Vargo et al); 16 pages.

U.S. Appl. No. 14/707,123 for Application Independent DEX/UCS Interface filed May 8, 2015 (Pape); 47 pages.

U.S. Appl. No. 14/283,282 for Terminal Having Illumination and Focus Control filed May 21, 2014 (Liu et al.); 31 pages; now abandoned.

U.S. Appl. No. 14/705,407 for Method and System to Protect Software-Based Network-Connected Devices From Advanced Persistent Threat filed May 6, 2015 (Hussey et al.); 42 pages.

(56) References Cited

OTHER PUBLICATIONS

U.S. Appl. No. 14/704,050 for Intermediate Linear Positioning filed May 5, 2015 (Charpentier et al.); 60 pages.

U.S. Appl. No. 14/705,012 for Hands-Free Human Machine Interface Responsive to a Driver of a Vehicle filed May 6, 2015 (Fitch et al.); 44 pages.

U.S. Appl. No. 14/715,672 for Augumented Reality Enabled Hazard Display filed May 19, 2015 (Venkatesha et al.); 35 pages.

U.S. Appl. No. 14/735,717 for Indicia-Reading Systems Having an Interface With a User's Nervous System filed Jun. 10, 2015 (Todeschini); 39 pages.

U.S. Appl. No. 14/702,110 for System and Method for Regulating Barcode Data Injection Into a Running Application on a Smart Device filed May 1, 2015 (Todeschini et al.); 38 pages.

U.S. Appl. No. 14/747,197 for Optical Pattern Projector filed Jun. 23, 2015 (Thuries et al.); 33 pages.

U.S. Appl. No. 14/702,979 for Tracking Battery Conditions filed May 4, 2015 (Young et al.); 70 pages.

U.S. Appl. No. 29/529,441 for Indicia Reading Device filed Jun. 8, 2015 (Zhou et al.); 14 pages.

U.S. Appl. No. 14/747,490 for Dual-Projector Three-Dimensional Scanner filed Jun. 23, 2015 (Jovanovski et al.); 40 pages.

U.S. Appl. No. 14/740,320 for Tactile Switch for a Mobile Electronic Device filed Jun. 16, 2015 (Barndringa); 38 pages.

U.S. Appl. No. 14/740,373 for Calibrating a Volume Dimensioner filed Jun. 16, 2015 (Ackley et al.); 63 pages.

U.S. Appl. No. 13/367,978, filed Feb. 7, 2012, (Feng et al.); now abandoned.

U.S. Appl. No. 14/277,337 for Multipurpose Optical Reader, filed May 14, 2014 (Jovanovski et al.); 59 pages; now abandoned.

U.S. Appl. No. 14/446,391 for Multifunction Point of Sale Apparatus With Optical Signature Capture filed Jul. 30, 2014 (Good et al.); 37 pages; now abandoned.

U.S. Appl. No. 29/516,892 for Table Computer filed Feb. 6, 2015 (Bidwell et al.); 13 pages.

U.S. Appl. No. 29/523,098 for Handle for a Tablet Computer filed Apr. 7, 2015 (Bidwell et al.); 17 pages.

U.S. Appl. No. 29/528,890 for Mobile Computer Housing filed Jun. 2, 2015 (Fitch et al.); 61 pages.

U.S. Appl. No. 29/526,918 for Charging Base filed May 14, 2015 (Fitch et al.); 10 pages.

Rugged PC Review.com; "Rugged Handhelds: Winmate E430T 4.3" rugged industrial PDA", dated Jan. 2013, 12 pages [Downloaded Jan. 19, 2017 from http://www.ruggedpcreview.com/3_handhelds_winmate_e430t.html}.

* cited by examiner

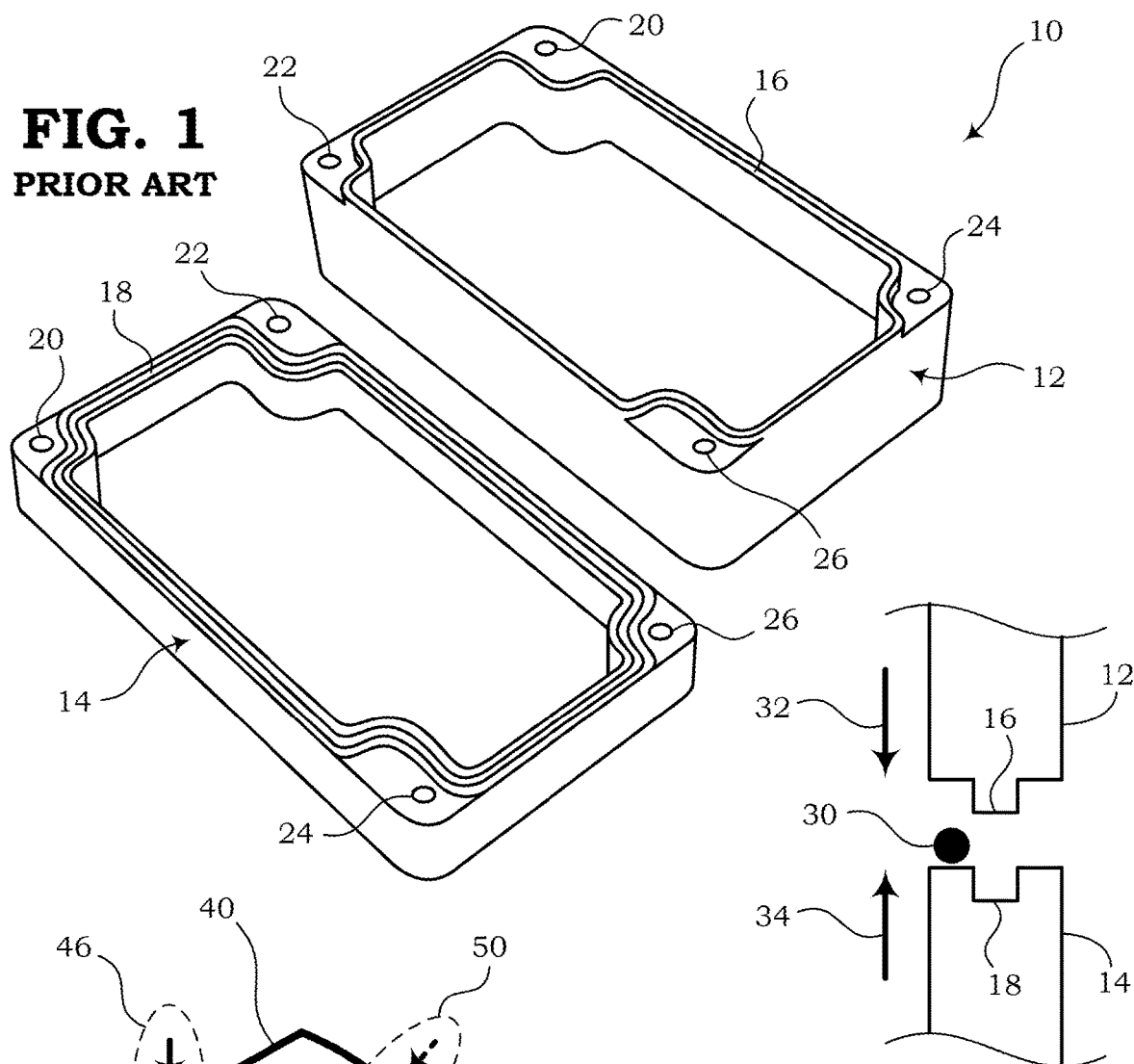
FIG. 1
PRIOR ART
FIG. 2
PRIOR ART
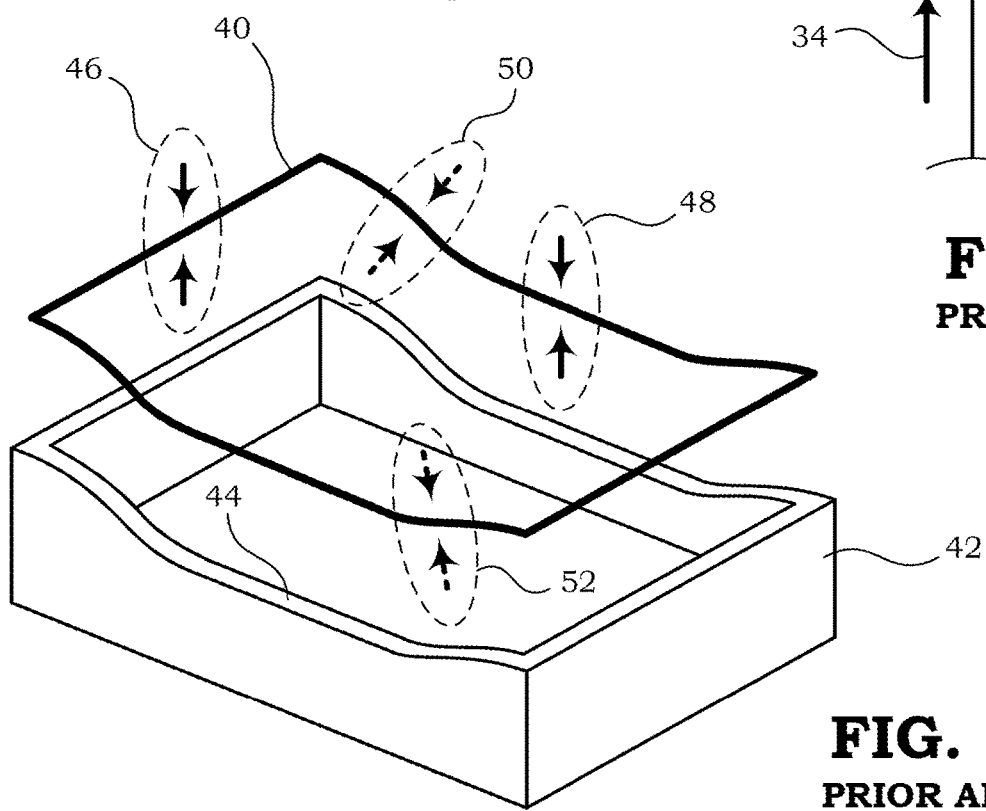
FIG. 3
PRIOR ART

APPARATUS FOR SEALING AN ENCLOSURE

FIELD OF THE INVENTION

The present invention relates to sealing assemblies for preventing water intrusion into the interior of a casing or enclosure.

BACKGROUND

Generally speaking, traditional methods for preventing water intrusion include using a silicon gasket that runs along a tongue and groove arrangement on corresponding halves of a casing or enclosure. This arrangement can be found in many handheld devices that might require a certain level of water resistance to protect the internal components of the device. Normally, these devices may include screws for connecting the corresponding top and bottom sections of the casing. The screws maintain a constant pressure for sealing the sections. However, if the top and bottom sections of the casing include a more complicated profile, such as with free-form sections, the screws do not provide constant pressure, because the screws can only provide pressure in one direction.

FIG. 1 is a perspective view of a casing 10 or housing, which incorporates a conventional sealing assembly for sealing a first section 12 of the casing 10 with a second section 14. The first section 12 includes a tongue component 16 and the second section 14 includes a groove component 18. When the tongue component 16 is aligned with the groove component 18, such as when one of the first or second sections 12, 14 is flipped upside down and placed on top of the other section, the tongue and groove arrangement 16, 18 creates a rudimentary sealing arrangement for allowing the casing 10 to provide a certain level of water tightness to protect the interior of the casing 10.

To ensure that the tongue component 16 is maintained within the groove component 18, screws or other hardware (not shown) can be inserted through pairs of holes 20, 22, 24, 26 in each of the first and second sections 12, 14. The pressure applied by the screws or other hardware is intended to keep the first section 12 held against the second section 14.

FIG. 2 is a cross-sectional side view of a portion of the casing 10 shown in FIG. 1, where the tongue component 16 of the first section 12 is aligned with the groove component 18 of the bottom section 14. FIG. 2 further shows a gasket 30 (or washer), which may be used in the conventional sealing assembly for increasing the water resistance of the casing 10. When the screws or other hardware are tightened, a first force, indicated by arrow 32, is applied on the first section 12 in a downward direction and a second force, as indicated by arrow 34, is applied on the second section 14 in an upward direction. Also, the forces 32, 34 may compress the gasket 30 to optimize its sealing effectiveness. Since the pairs of holes 20, 22, 24, 26 for the screws are oriented in a substantially vertical orientation, the forces 32, 34 will consequently be applied vertically as well.

FIG. 3 schematically depicts a perspective view of a gasket 40 used in another conventional sealing assembly having a more complex free-form profile. In this illustration, only a bottom portion 42 of a casing is shown, but it should be noted that an upper portion having a corresponding profile may be used with the bottom portion 42.

The upper rim 44 of the bottom portion 42 of the casing includes a non-planar surface, which may be common in many conventional casings having such a free-form profile. If downward and upward forces 32, 34 (FIG. 2) are applied to the casing of FIG. 3, the forces 32, 34 will not be uniform on each portion of the gasket 40, since the gasket 40 will be pressed at an angle with respect to the rim 44 having the non-uniform profile.

The horizontal portions of the rim 44 will enable the gasket 40 to be pressed evenly, such as at locations 46 and 48. However, the gasket 40 would need to be pressed at an angle, such as at locations 50 and 52, to correspond to the orientation of the rim 44 at those locations 50, 52. However, as mentioned above, the screws or other hardware are only configured to provide up and down forces and are unable to provide forces at the angles indicated by the arrows in locations 50, 52.

Therefore, a need exists for water-resistant sealing assemblies for enabling uniform forces to be applied around a periphery of a free-form casing. Such uniform pressure may help to maintain a constant force on sealing components (even at an angle) and can provide improved sealing functionality.

SUMMARY

Accordingly, in one aspect, the present invention embraces sealing assemblies for providing water resistance to casings, housings, and enclosures. Not only do the sealing assemblies disclosed herein provide water-resistance, but they also provide an even distribution of pressure around the periphery of the casings regardless of the physical characteristics of the free-form profile of the casings.

In an exemplary embodiment, a sealing assembly includes a peripheral side wall at least partially surrounding a frame of an electronic device. The sealing assembly further includes a seal element formed at least partially on an outside surface of the peripheral side wall, wherein the seal element includes a first edge component and a second edge component. The sealing assembly further includes a top section having a lower wall, wherein the first edge component of the seal element is configured to be compressed by the lower wall of the top section. Also, the sealing assembly includes a bottom section having an upper wall, wherein the second edge component of the seal element is configured to be compressed by the upper wall of the bottom section. The seal element is configured to seal a gap between the top section and the bottom section.

In another exemplary embodiment, a water-resistant casing for protecting against water intrusion is disclosed. The water-resistant casing comprises a sealing element overmolded on a wall, wherein the sealing element includes a first feature and a second feature. The casing also includes a top section constrained in a lower position by the first feature of the sealing element and a bottom section constrained in an upper position by the second feature of the sealing element.

The foregoing illustrative summary, as well as other exemplary objectives and/or advantages of the invention, and the manner in which the same are accomplished, are further explained within the following detailed description and its accompanying drawings.

BRIEF DESCRIPTION OF THE DRAWINGS

FIG. 1 schematically depicts a perspective view of a conventional sealing assembly.

FIG. 2 schematically depicts a cross-sectional side view of a gasket used in the conventional sealing assembly.

FIG. 3 schematically depicts an isometric view of another conventional sealing assembly having a free-form casing sections and gasket.

DETAILED DESCRIPTION

The present invention embraces sealing assemblies and systems and methods for assembling a sealing apparatus that provide sufficient sealing properties for a casing, housing, or other type of enclosure. The sealing apparatus provides surface sealing using an over-molded substance, such as rubber, thermoplastic elastomer (TPE), or other suitable material. Not only does the substance provide sealing or water-resistance properties, but also the profile of the substance, in coordination with a corresponding profile of the top and bottom sections of the casing, aids in the assembly of the casing for an electronic device and provides an evenly distributed compression along the walls of the top and bottom sections.

Figure 4:
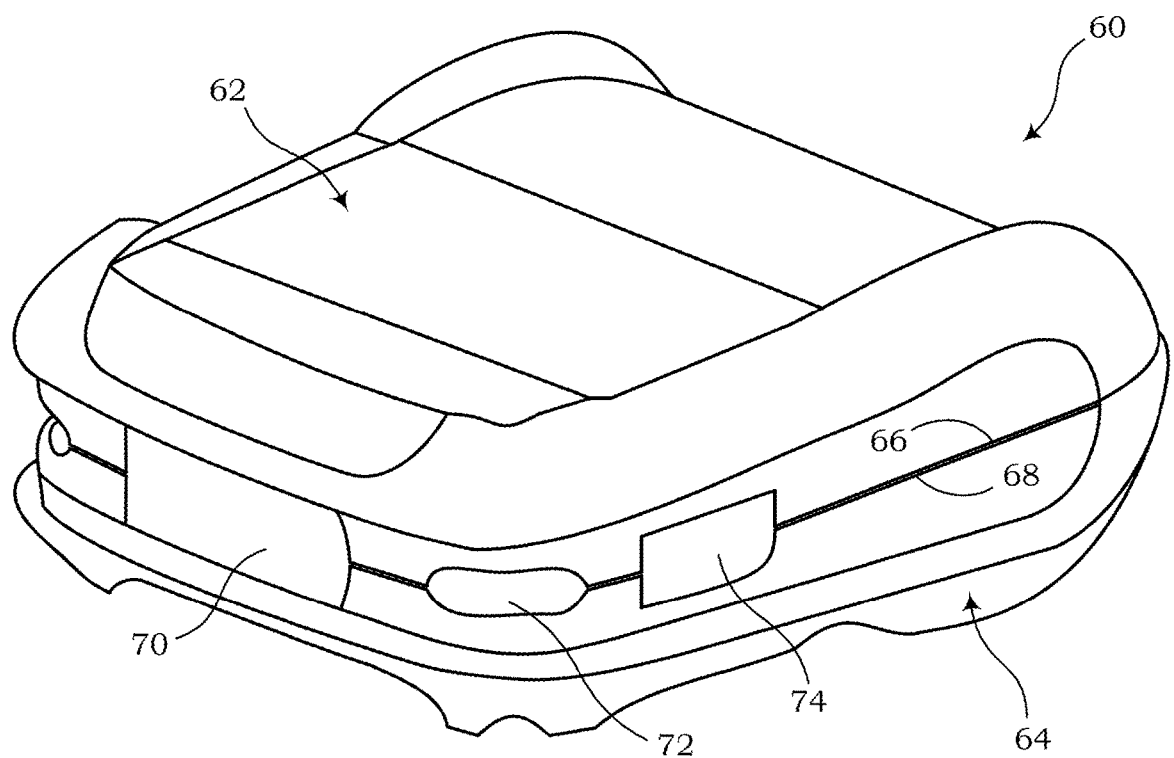
FIG. 4 schematically depicts a perspective view of a casing of a mobile printer according to various embodiments of the present invention.

FIG. 4 is a perspective view showing an embodiment of a casing 60 of a mobile printer. In this embodiment, the casing 60 may include a clam-shaped enclosure or other free-form design. The mobile printer may be a thermal printer for printing onto labels or other media. At times, a user may need to open the mobile printer in order to add print media (e.g., blank labels), to change a printer cartridge, to remove clogged print material, or to perform other regular maintenance activities.

In this embodiment, the casing 60 includes a top section 62 and a bottom section 64. The top and bottom section 62, 64 may be pivoted about a rear axis (not shown) to allow the top section 62 to be lifted upward and/or to allow the bottom section 64 to be dropped downward to allow access to the interior of the casing 60. The casing 60 includes a sealing assembly, shown in FIG. 5 for providing water tightness to the casing 60. Therefore, the mobile printer of FIG. 4 includes a water-resistant casing 60 for preventing water intrusion into the interior of the casing 60 to protect the printed circuit boards, electronics, and other components located inside the casing 60.

The top section 62 includes a bottom rim 66 that extends around the periphery of the casing 60 and the bottom section 64 includes a top rim 68 that also extends around the periphery of the casing 60. The bottom rim 66 may be adjacent to and/or may contact the top rim 68 at various locations around the casing 60.

The casing 60 may include portions 70, 72, 74 that are not covered by the top or bottom sections 62, 64 when the sections 62, 64 are in a closed position. Therefore, it may be understood that the bottom rim 66 of the top section 62 and the top rim 68 of the bottom section 64 are non-planar. Also, the profile of the bottom rim 66 does not necessarily correspond to the profile of the top rim 68. However, in order to overcome the deficiency of the prior art as described with respect to FIG. 3, the casing 60 of the present invention includes features that allow equal pressure to be applied at various locations around the periphery of the casing 60, regardless of the physical features (e.g., angles) of the rims 66, 68 at each point.

Figure 5:
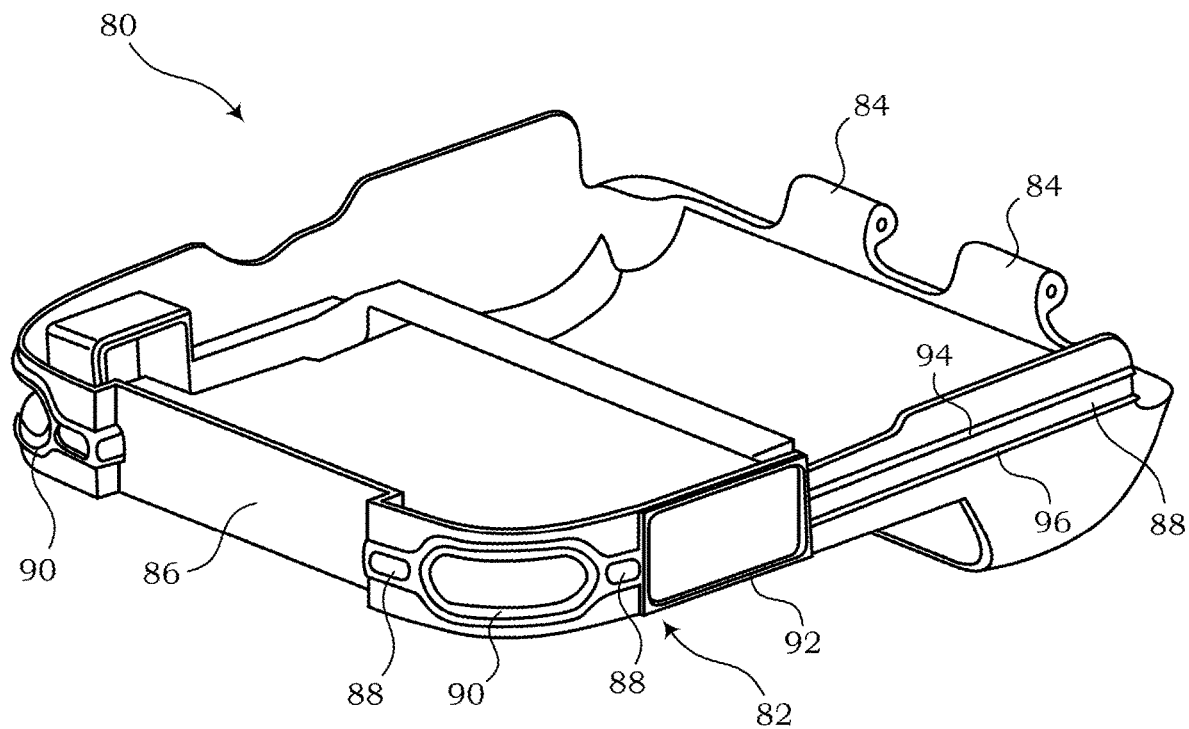
FIG. 5 schematically depicts a perspective view of a frame of the mobile printer of FIG. 4 and a sealing assembly according to various embodiments of the present invention.

FIG. 5 is a perspective view of a frame 80 of the mobile printer of FIG. 4. The frame 80 is positioned inside the casing 60 and is surrounded by the top and bottom sections 62, 64. FIG. 5 also shows a sealing assembly 82 including many features according to the various teachings of the present invention.

The frame 80 includes a part of an electronic device (e.g., mobile printer) and/or is configured as a side wall around the periphery of the electronic device. In some embodiments, the frame 80 may include one or more axels 84 defining an axis about which the top section 62 and/or bottom section 64 may be rotated. In other embodiments, the frame 80 may be attached to the bottom section 64, wherein the top section 62 can pivot about the axels 84 with respect to the frame 80 and bottom section 64.

According to various implementations, the frame 80 may include a side wall 86 that extends around the periphery thereof. The sealing assembly 82 may be discontinuous and does not necessarily extend around the entire periphery of the frame 80. The sealing assembly 82 can be attached to the side wall 86 using any suitable attachment method and including any suitable attachment elements. In some embodiments, the sealing assembly 82 may be over-molded on the side wall 86 to prevent water seepage between the two.

The sealing assembly 82 may include any design depending on the free-form features of the electronic device and/or frame 80. In some cases, the sealing assembly 82 may include features to surround user interface elements. As illustrated in FIG. 5, the sealing assembly 82 includes various distinct features that are described in more detail below. For example, the sealing assembly 82 may include one or more horizontal sections 88, one or more divergent sections 90, one or more framing sections 92, and/or other types of sections as needed depending on the physical design of the electronic device.

The sealing element 82 may include a first feature 94 and a second feature 96. The first and second features 94, 96 may be extensions, protrusions, edges, etc. for engaging with the rims of the top and bottom sections 62, 64. The first feature 94, located adjacent to the top of the sealing element 82, is configured to engage with a bottom rim of the top section 62. The section feature 96, located adjacent to the bottom of the sealing element 82, is configured to engage with a top rim of the bottom section 64.

The first feature 94 may be configured to engage portions of the top section 62 to hold the top section 62 in place. The second feature 96 may be configured to engage portions of the bottom section 64 to hold the bottom section 64 in place. Thus, a wall component that extends down from the top section 62 may be constrained in a lower position by the first feature 94 of the sealing element 82. Also, a wall component that extends up from the bottom section 64 may be constrained in an upper position by the second feature 96 of the sealing element 82.

It may be noted that the first feature 94 may be horizontal along the horizontal sections 88 of the sealing assembly 82 and may be curved along the divergent sections 90, framing sections 92, or other non-uniform sections of the sealing assembly 82. According to some embodiments, the sealing features may continue about the entire side wall 86 and/or may continue around any openings in the enclosure.

The frame 80 may be configured to support a user interface that is positioned at a front section of the side wall 86 of the frame 80. In some embodiments, a molded TPE gasket may be formed around the location of the user interface. The gasket may use a top to bottom seal that is pinched when screws are tightened on the frame 80. The sealing assembly 82 may further include a rib structure that can be compressed against the inside walls of the top and bottom sections 62, 64. The gasket and corresponding user interface can therefore be interchangeable elements. In this way, different kinds of user interfaces can be attached to the frame 80 depending on the features corresponding to the respective model of the mobile printer. For example, the user interfaces may include LEDs, LCDs, OLEDs, and/or other suitable interface devices.

Figure 6A:
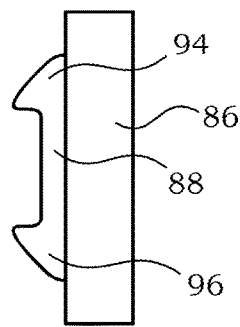
FIGS. 6A-6C schematically depict cross-sectional side views of portions of the casing and sealing assembly shown in FIGS. 4 and 5, according to various embodiments of the present invention.

FIG. 6A is a cross-sectional side view of an embodiment of one of the horizontal sections 88 of the sealing assembly 82 attached to the side wall 86 of the frame 80. In this embodiment, the first feature 94 and second feature 96 are configured as collapsible ribs. The horizontal section 88 is shown before the top and bottom sections 62, 64 are moved into a closed position.

Figure 6B:
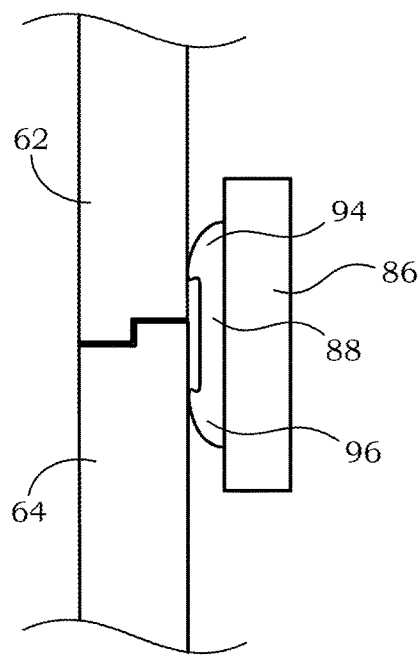

FIG. 6B is a cross-sectional side view of the horizontal section 88 of FIG. 6A after the top and bottom sections 62, 64 are moved into the closed position and the walls thereof are pressed against the collapsible ribs 94, 96 of the horizontal section 88. The sealing assembly is designed with an intentional interference fit for pressing the inner walls of the top and bottom sections 62, 64 against the collapsible ribs 94, 96 to create a seal. In some embodiments, the top and bottom sections 62, 64 may compress the ribs 94, 96 to a greater extent such that the inner walls of the sections 62, 64 contact the entire height of the horizontal section 88 of the sealing assembly 82.

Figure 6C:
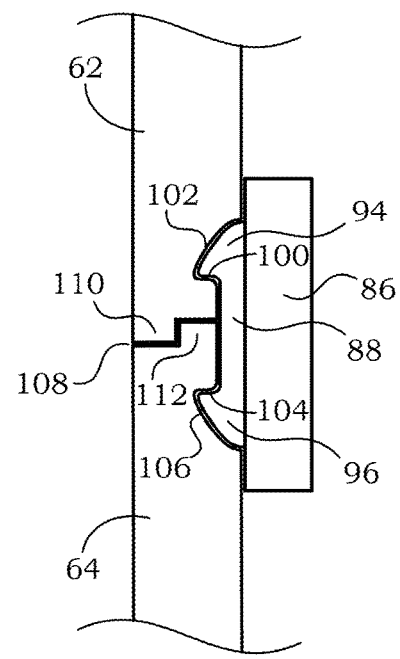

FIG. 6C is a cross-sectional side view showing portions of the casing and sealing assembly 82 shown in FIGS. 4 and 5 according to another embodiment. As shown in FIG. 6C, the horizontal section 88 of the sealing assembly 82 is attached to the side wall 86 of the frame 80 of the electronic device. The sealing assembly 82 may be over-molded on the side wall 86. The first feature 94 of the sealing assembly 82 may include an upper ledge 100 that is configured to engage with a notch 102 in a downwardly extending wall of the top section 62 of the casing 60. Also, the second feature 96 of the sealing assembly 82 may include a lower ledge 104 that is configured to engage with a notch 106 in an upwardly extending wall of the bottom section 64 of the casing 60.

The ledges 100 and 104 and the notches 102, 106 may include any suitable shape to hold the top and bottom sections 62, 64 in place. Therefore, the sealing assembly 82 not only acts as a seal, but it also acts as a securing mechanism for providing at least a locking or frictional force on the sections 62, 64 to assist in the prevention of water intrusion into the interior of the casing 60.

Therefore, according to some implementations, the sealing assembly 82 may comprise a peripheral side wall (e.g., side wall 86) at least partially surrounding the frame 80 of an electronic device. A seal element (e.g., horizontal sealing section 88 or at least another portion of the sealing assembly 82) may be formed at least partially on an outside surface of the peripheral side wall 86.

The seal element 88 may include a first edge component (e.g., upper ledge 100) and a second edge component (e.g., lower ledge 104). An upper wall section (e.g., at least a portion of the top section 62) may include a first notch (e.g., notch 102), wherein the first edge component 100 of the seal element 88 is configured to engage the first notch 102 to constrain the upper wall section in a lower position. Also, a lower wall section (e.g., at least a portion of the bottom section 64) may include a second notch (e.g., notch 106), wherein the second edge component 104 of the seal element 88 is configured to engage the second notch 106 to constrain the lower wall section in an upper position. The seal element 88 is configured to seal a gap 108 between the upper wall section 62 and the lower wall section 64.

In some embodiments, the top section 62 may include a lip 110 that overhangs an extension 112 of the bottom section 64. The lip 110 and extension 112 may be formed to enable compatible engagement of the top section 62 with the bottom section 64. Also, other suitable corresponding features may be formed in the lower rim of the top section 62 and upper rim of the bottom section 64 to keep the sections 62, 64 in contact with each other, thus assisting in the prevention of water intrusion into the interior of the casing 60. Also, first edge component 100 and second edge component 104 may be configured to hold the upper wall section 62 and lower wall section 64 in contact with each other.

The lower rim of the top wall section 62 may be non-planar and an upper rim of the bottom wall section 64 may also be non-planar. The lower rim of the top wall section 62 may include a profile that differs from a profile of the upper rim of the bottom wall section 64. In some embodiments, the lower rim of the top wall section 62 may include at least one tongue element that is compatible with at least one groove element of the upper rim of the bottom wall section 64.

Figure 7:
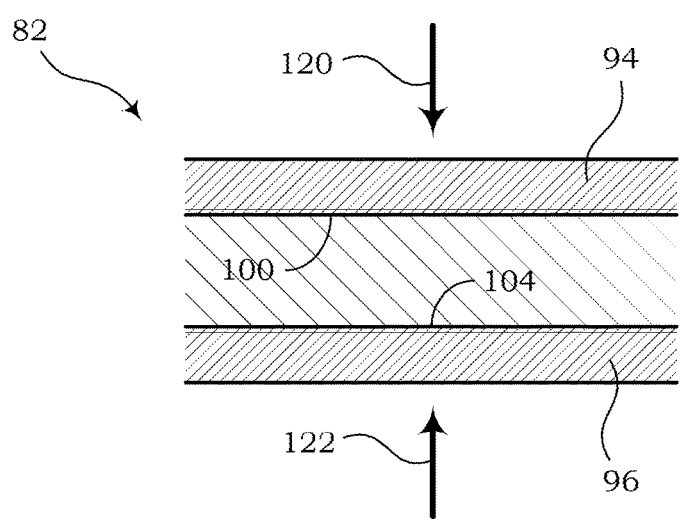
FIG. 7 schematically depicts a front view of a first portion of the sealing assembly shown in FIG. 5, according to various embodiments of the present invention.

FIG. 7 is a front view illustrating an embodiment of a first portion of the sealing assembly 82 shown in FIG. 5. For example, the illustrated portion may represent any of the horizontal sections 88 of the sealing assembly 82 or other similar sections where the sealing assembly 82 and the rims of the top and bottom sections 64, 66 are substantially horizontal with respect to a reference plane defining the general structure of the frame 80 of the electronic device.

As illustrated, the first feature 94 of the sealing assembly 82 includes the upper ledge 100 (also shown in FIG. 6), which is configured to engage the notch 102 of the top section 62. The second feature 96 of the sealing assembly 82 includes the lower ledge 104, which is configured to engage the notch 106 of the bottom section 64.

It should be noted that the lower rim of the top section 62 includes the notch 102 arranged parallel with the upper ledge 100 and the upper rim of the bottom section 64 includes the notch 106 arranged parallel with the lower ledge 104. Because the upper and lower ledges 100, 104 are also substantially horizontal with respect to the frame 80, the top section 62 is biased in a downward direction 120 and the bottom section 64 is biased in an upward direction 122. The directions, as indicated by arrows 120, 122, are substantially perpendicular with the ledges 100, 104 and parallel with an imaginary axis perpendicularly running through a plane defining the frame 80. Therefore, the forces 120, 122 are directed appropriately for biasing the top and bottom sections 62, 64 at the portions of the sealing assembly 82 that are horizontal.

Therefore, any point along a first vertical portion of the seal element (e.g., horizontal sealing section 88) represented in FIG. 7 applies a first force in the first direction 120 to a first vertical portion of the upper wall section (e.g., top section 62) and applies a second force in the second direction 122 to a first vertical portion of the lower wall section (e.g., bottom section 64). The first direction 120 may be substantially opposite to the second direction 122. Also, the first and second directions 120, 122 may be substantially perpendicular to a plane defining the frame 80 of the electronic device.

Figure 8:
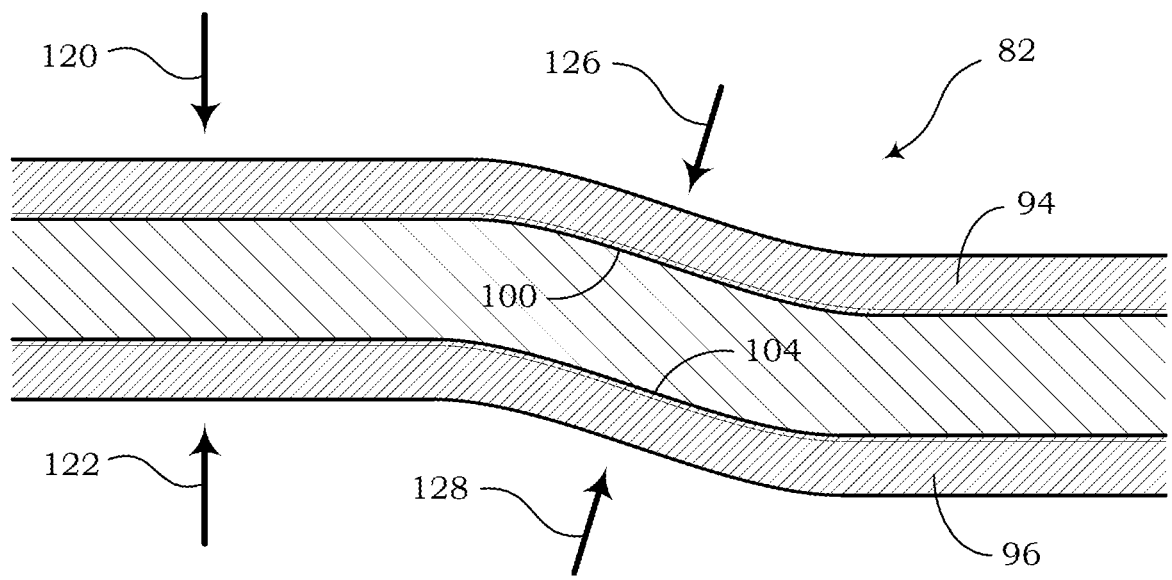
FIG. 8 schematically depicts a front view of a second portion of the sealing assembly shown in FIG. 5, according to various embodiments of the present invention.

FIG. 8 is a front view of an embodiment of a second portion of a seal element, which may represent a portion of the sealing assembly 82 shown in FIG. 5. The second portion represents one or more sections of the sealing assembly 82 where the lower rim 66 of the top section 62 and the upper rim 68 of the bottom section 64 are not completely horizontal, but may include a more complex free-form profile. Depending on the particular design, the rims 66, 68 may include waves, slopes, angles, etc. The first and second features 94, 96 of the sealing assembly 82 may be designed to follow the same profile of each of the rims 66, 68 of the top and bottom sections 62, 64.

At the points along horizontal portions around the periphery of the frame 80 where the rims 66, 68 are at an angle, the upper ledge 100 of the first feature 94 applies a force at an angle in the direction of arrow 126 onto the notch 102 of the top section 62, wherein the notch 102 is also formed with the same angle to enable engagement with the upper ledge 100. Likewise, the lower ledge 104 of the second feature 96 of the sealing assembly 82 applies a force at an angle in the direction of arrow 128 onto the notch 106 of the bottom section 64, wherein the notch 106 is formed with the same angle to enable engagement with the lower ledge 104.

The water-resistant casing 60 is therefore configured such that points along a second vertical portion of the sealing element 82, as illustrated in FIG. 8, is configured to apply a force at a first angle 126 to the top wall section 62 and is configured to apply a force at a second angle 128 to the bottom wall section 64. The first and second angles 126, 128 are oriented at acute angles with respect to the imaginary axis running perpendicular to a plane defining the frame of the electronic device.

Figure 9:
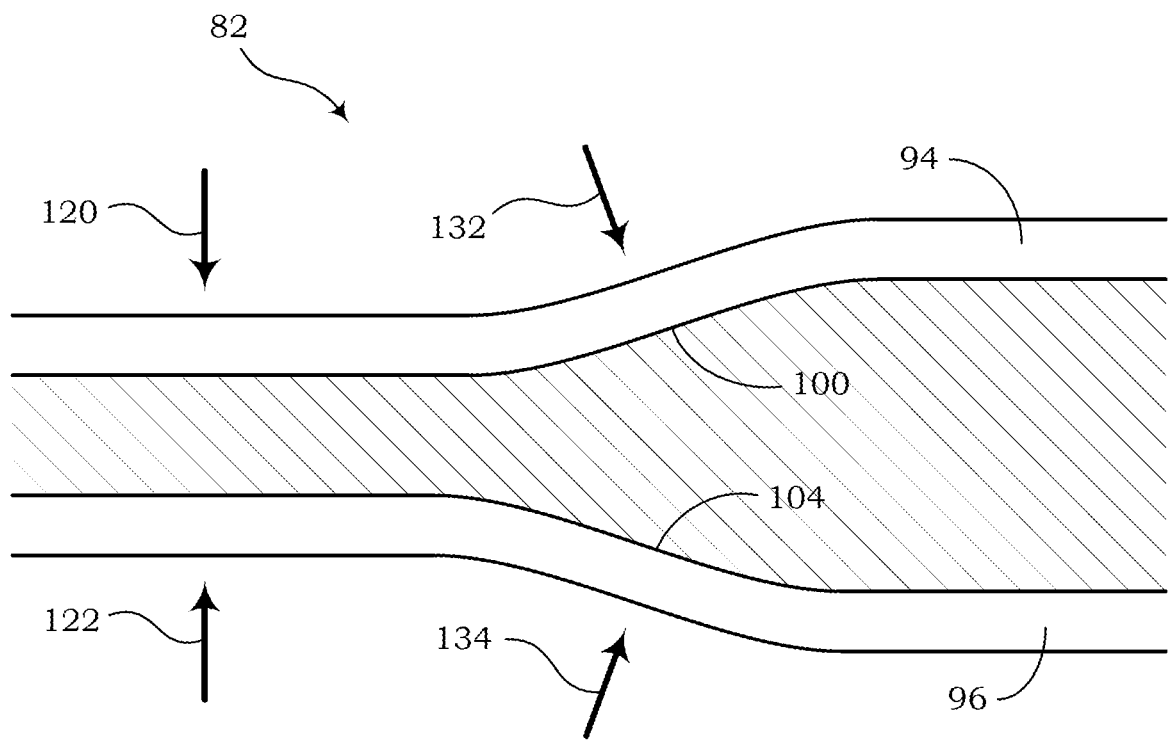
FIG. 9 schematically depicts a front view of a third portion of the sealing assembly shown in FIG. 5, according to various embodiments of the present invention.

FIG. 9 shows a front view of an embodiment of a third portion of the sealing assembly 82 shown in FIG. 5. The third portion may represent the diverging section 90, framed section 92, or other sections where the rims 66, 68 of the top and bottom sections 62, 64 do not follow the same path. Instead, going from left to right, the top section 62 may include a receding rim 66 (i.e., receding upward) and the bottom section 64 may also include a receding rim 68 (i.e., receding downward). Correspondingly, the upper ledge 100 of the first feature 94 of the sealing assembly 82 follows the profile of the top section 62 and the lower ledge 104 of the second feature 96 of the sealing assembly 82 follows the profile of the bottom section 64.

The upper ledge 100 thereby applies an angled force directed as shown by arrow 132 onto the top section 62 at points along the horizontal portion of the top section 62 that is sloped. Likewise, the lower ledge 104 applies an angled force directed as shown by arrow 134 onto the bottom section 64 at the horizontal portion of the bottom section 64 that is sloped. Therefore, the forces again are applied equally, regardless of the point along the notches 102, 106 of the top and bottom section 62, 64, where the notches are designed to follow the elevation of the ledges 100, 104 along the lengths thereof.

Therefore, another vertical portion of the seal element or sealing assembly 82 applies another force in a direction defined by arrow 132 to a vertical portion of the upper wall section and applies another force in a direction defined by arrow 134 to a vertical portion of the lower wall section. The directions 132, 134 are oriented at acute angles with respect to the directions 120, 122 of the horizontal sections. In FIG. 8, the direction 126 is substantially opposite to the direction 128. However, in FIG. 9, the direction 132 is non-linear with the direction 134.

The lower rim 66 of the upper wall section 62 and the upper rim 68 of the lower wall section 64 may have varying elevations. In addition, the lower rim 66 may have a non-uniform edge 110 that is compatible with a non-uniform edge 112 of the upper rim 68. The sealing assembly 82 may include seal elements that comprise a thermoplastic elastomer or other suitable material for providing sealing functionality, but with sufficient strength to engage the ends of the sections 62, 64 for holding the sections 62, 64 in place.

To supplement the present disclosure, this application incorporates entirely by reference the following commonly assigned patents, patent application publications, and patent applications:

U.S. Pat. Nos. 6,832,725; 7,128,266;
U.S. Pat. Nos. 7,159,783; 7,413,127;
U.S. Pat. Nos. 7,726,575; 8,294,969;
U.S. Pat. Nos. 8,317,105; 8,322,622;
U.S. Pat. Nos. 8,366,005; 8,371,507;
U.S. Pat. Nos. 8,376,233; 8,381,979;
U.S. Pat. Nos. 8,390,909; 8,408,464;
U.S. Pat. Nos. 8,408,468; 8,408,469;
U.S. Pat. Nos. 8,424,768; 8,448,863;
U.S. Pat. Nos. 8,457,013; 8,459,557;
U.S. Pat. Nos. 8,469,272; 8,474,712;
U.S. Pat. Nos. 8,479,992; 8,490,877;
U.S. Pat. Nos. 8,517,271; 8,523,076;
U.S. Pat. Nos. 8,528,818; 8,544,737;
U.S. Pat. Nos. 8,548,242; 8,548,420;
U.S. Pat. Nos. 8,550,335; 8,550,354;
U.S. Pat. Nos. 8,550,357; 8,556,174;
U.S. Pat. Nos. 8,556,176; 8,556,177;
U.S. Pat. Nos. 8,559,767; 8,599,957;
U.S. Pat. Nos. 8,561,895; 8,561,903;
U.S. Pat. Nos. 8,561,905; 8,565,107;
U.S. Pat. Nos. 8,571,307; 8,579,200;
U.S. Pat. Nos. 8,583,924; 8,584,945;
U.S. Pat. Nos. 8,587,595; 8,587,697;
U.S. Pat. Nos. 8,588,869; 8,590,789;
U.S. Pat. Nos. 8,596,539; 8,596,542;
U.S. Pat. Nos. 8,596,543; 8,599,271;
U.S. Pat. Nos. 8,599,957; 8,600,158;
U.S. Pat. Nos. 8,600,167; 8,602,309;
U.S. Pat. Nos. 8,608,053; 8,608,071;
U.S. Pat. Nos. 8,611,309; 8,615,487;
U.S. Pat. Nos. 8,616,454; 8,621,123;
U.S. Pat. Nos. 8,622,303; 8,628,013;
U.S. Pat. Nos. 8,628,015; 8,628,016;
U.S. Pat. Nos. 8,629,926; 8,630,491;
U.S. Pat. Nos. 8,635,309; 8,636,200;
U.S. Pat. Nos. 8,636,212; 8,636,215;
U.S. Pat. Nos. 8,636,224; 8,638,806;
U.S. Pat. Nos. 8,640,958; 8,640,960;
U.S. Pat. Nos. 8,643,717; 8,646,692;
U.S. Pat. Nos. 8,646,694; 8,657,200;
U.S. Pat. Nos. 8,659,397; 8,668,149;
U.S. Pat. Nos. 8,678,285; 8,678,286;
U.S. Pat. Nos. 8,682,077; 8,687,282;

U.S. Pat. Nos. 8,692,927; 8,695,880;
U.S. Pat. Nos. 8,698,949; 8,717,494;
U.S. Pat. Nos. 8,717,494; 8,720,783;
U.S. Pat. Nos. 8,723,804; 8,723,904;
U.S. Pat. No. 8,727,223; U.S. Pat. No. D702,237;
U.S. Pat. Nos. 8,740,082; 8,740,085;
U.S. Pat. Nos. 8,746,563; 8,750,445;
U.S. Pat. Nos. 8,752,766; 8,756,059;
U.S. Pat. Nos. 8,757,495; 8,760,563;
U.S. Pat. Nos. 8,763,909; 8,777,108;
U.S. Pat. Nos. 8,777,109; 8,779,898;
U.S. Pat. Nos. 8,781,520; 8,783,573;
U.S. Pat. Nos. 8,789,757; 8,789,758;
U.S. Pat. Nos. 8,789,759; 8,794,520;
U.S. Pat. Nos. 8,794,522; 8,794,525;
U.S. Pat. Nos. 8,794,526; 8,798,367;
U.S. Pat. Nos. 8,807,431; 8,807,432;
U.S. Pat. Nos. 8,820,630; 8,822,848;
U.S. Pat. Nos. 8,824,692; 8,824,696;
U.S. Pat. Nos. 8,842,849; 8,844,822;
U.S. Pat. Nos. 8,844,823; 8,849,019;
U.S. Pat. Nos. 8,851,383; 8,854,633;
U.S. Pat. Nos. 8,866,963; 8,868,421;
U.S. Pat. Nos. 8,868,519; 8,868,802;
U.S. Pat. Nos. 8,868,803; 8,870,074;
U.S. Pat. Nos. 8,879,639; 8,880,426;
U.S. Pat. Nos. 8,881,983; 8,881,987;
U.S. Pat. Nos. 8,903,172; 8,908,995;
U.S. Pat. Nos. 8,910,870; 8,910,875;
U.S. Pat. Nos. 8,914,290; 8,914,788;
U.S. Pat. Nos. 8,915,439; 8,915,444;
U.S. Pat. Nos. 8,916,789; 8,918,250;
U.S. Pat. Nos. 8,918,564; 8,925,818;
U.S. Pat. Nos. 8,939,374; 8,942,480;
U.S. Pat. Nos. 8,944,313; 8,944,327;
U.S. Pat. Nos. 8,944,332; 8,950,678;
U.S. Pat. Nos. 8,967,468; 8,971,346;
U.S. Pat. Nos. 8,976,030; 8,976,368;
U.S. Pat. Nos. 8,978,981; 8,978,983;
U.S. Pat. Nos. 8,978,984; 8,985,456;
U.S. Pat. Nos. 8,985,457; 8,985,459;
U.S. Pat. Nos. 8,985,461; 8,988,578;
U.S. Pat. Nos. 8,988,590; 8,991,704;
U.S. Pat. Nos. 8,996,194; 8,996,384;
U.S. Pat. Nos. 9,002,641; 9,007,368;
U.S. Pat. Nos. 9,010,641; 9,015,513;
U.S. Pat. Nos. 9,016,576; 9,022,288;
U.S. Pat. Nos. 9,030,964; 9,033,240;
U.S. Pat. Nos. 9,033,242; 9,036,054;
U.S. Pat. Nos. 9,037,344; 9,038,911;
U.S. Pat. Nos. 9,038,915; 9,047,098;
U.S. Pat. Nos. 9,047,359; 9,047,420;
U.S. Pat. Nos. 9,047,525; 9,047,531;
U.S. Pat. Nos. 9,053,055; 9,053,378;
U.S. Pat. Nos. 9,053,380; 9,058,526;
U.S. Pat. Nos. 9,064,165; 9,064,167;
U.S. Pat. Nos. 9,064,168; 9,064,254;
U.S. Pat. Nos. 9,066,032; 9,070,032;
U.S. Design Pat. No. D716,285;
U.S. Design Pat. No. D723,560;
U.S. Design Pat. No. D730,357;
U.S. Design Pat. No. D730,901;
U.S. Design Pat. No. D730,902;
U.S. Design Pat. No. D733,112;
U.S. Design Pat. No. D734,339;
International Publication No. 2013/163789;
International Publication No. 2013/173985;
International Publication No. 2014/019130;
International Publication No. 2014/110495;
U.S. Patent Application Publication No. 2008/0185432;
U.S. Patent Application Publication No. 2009/0134221;
U.S. Patent Application Publication No. 2010/0177080;
U.S. Patent Application Publication No. 2010/0177076;
U.S. Patent Application Publication No. 2010/0177707;
U.S. Patent Application Publication No. 2010/0177749;
U.S. Patent Application Publication No. 2010/0265880;
U.S. Patent Application Publication No. 2011/0202554;
U.S. Patent Application Publication No. 2012/0111946;
U.S. Patent Application Publication No. 2012/0168511;
U.S. Patent Application Publication No. 2012/0168512;
U.S. Patent Application Publication No. 2012/0193423;
U.S. Patent Application Publication No. 2012/0203647;
U.S. Patent Application Publication No. 2012/0223141;
U.S. Patent Application Publication No. 2012/0228382;
U.S. Patent Application Publication No. 2012/0248188;
U.S. Patent Application Publication No. 2013/0043312;
U.S. Patent Application Publication No. 2013/0082104;
U.S. Patent Application Publication No. 2013/0175341;
U.S. Patent Application Publication No. 2013/0175343;
U.S. Patent Application Publication No. 2013/0257744;
U.S. Patent Application Publication No. 2013/0257759;
U.S. Patent Application Publication No. 2013/0270346;
U.S. Patent Application Publication No. 2013/0287258;
U.S. Patent Application Publication No. 2013/0292475;
U.S. Patent Application Publication No. 2013/0292477;
U.S. Patent Application Publication No. 2013/0293539;
U.S. Patent Application Publication No. 2013/0293540;
U.S. Patent Application Publication No. 2013/0306728;
U.S. Patent Application Publication No. 2013/0306731;
U.S. Patent Application Publication No. 2013/0307964;
U.S. Patent Application Publication No. 2013/0308625;
U.S. Patent Application Publication No. 2013/0313324;
U.S. Patent Application Publication No. 2013/0313325;
U.S. Patent Application Publication No. 2013/0342717;
U.S. Patent Application Publication No. 2014/0001267;
U.S. Patent Application Publication No. 2014/0008439;
U.S. Patent Application Publication No. 2014/0025584;
U.S. Patent Application Publication No. 2014/0034734;
U.S. Patent Application Publication No. 2014/0036848;
U.S. Patent Application Publication No. 2014/0039693;
U.S. Patent Application Publication No. 2014/0042814;
U.S. Patent Application Publication No. 2014/0049120;
U.S. Patent Application Publication No. 2014/0049635;
U.S. Patent Application Publication No. 2014/0061306;
U.S. Patent Application Publication No. 2014/0063289;
U.S. Patent Application Publication No. 2014/0066136;
U.S. Patent Application Publication No. 2014/0067692;
U.S. Patent Application Publication No. 2014/0070005;
U.S. Patent Application Publication No. 2014/0071840;
U.S. Patent Application Publication No. 2014/0074746;
U.S. Patent Application Publication No. 2014/0076974;
U.S. Patent Application Publication No. 2014/0078341;
U.S. Patent Application Publication No. 2014/0078345;
U.S. Patent Application Publication No. 2014/0097249;
U.S. Patent Application Publication No. 2014/0098792;
U.S. Patent Application Publication No. 2014/0100813;
U.S. Patent Application Publication No. 2014/0103115;
U.S. Patent Application Publication No. 2014/0104413;
U.S. Patent Application Publication No. 2014/0104414;
U.S. Patent Application Publication No. 2014/0104416;
U.S. Patent Application Publication No. 2014/0104451;
U.S. Patent Application Publication No. 2014/0106594;
U.S. Patent Application Publication No. 2014/0106725;
U.S. Patent Application Publication No. 2014/0108010;

U.S. Patent Application Publication No. 2014/0108402;
U.S. Patent Application Publication No. 2014/0110485;
U.S. Patent Application Publication No. 2014/0114530;
U.S. Patent Application Publication No. 2014/0124577;
U.S. Patent Application Publication No. 2014/0124579;
U.S. Patent Application Publication No. 2014/0125842;
U.S. Patent Application Publication No. 2014/0125853;
U.S. Patent Application Publication No. 2014/0125999;
U.S. Patent Application Publication No. 2014/0129378;
U.S. Patent Application Publication No. 2014/0131438;
U.S. Patent Application Publication No. 2014/0131441;
U.S. Patent Application Publication No. 2014/0131443;
U.S. Patent Application Publication No. 2014/0131444;
U.S. Patent Application Publication No. 2014/0131445;
U.S. Patent Application Publication No. 2014/0131448;
U.S. Patent Application Publication No. 2014/0133379;
U.S. Patent Application Publication No. 2014/0136208;
U.S. Patent Application Publication No. 2014/0140585;
U.S. Patent Application Publication No. 2014/0151453;
U.S. Patent Application Publication No. 2014/0152882;
U.S. Patent Application Publication No. 2014/0158770;
U.S. Patent Application Publication No. 2014/0159869;
U.S. Patent Application Publication No. 2014/0166755;
U.S. Patent Application Publication No. 2014/0166759;
U.S. Patent Application Publication No. 2014/0168787;
U.S. Patent Application Publication No. 2014/0175165;
U.S. Patent Application Publication No. 2014/0175172;
U.S. Patent Application Publication No. 2014/0191644;
U.S. Patent Application Publication No. 2014/0191913;
U.S. Patent Application Publication No. 2014/0197238;
U.S. Patent Application Publication No. 2014/0197239;
U.S. Patent Application Publication No. 2014/0197304;
U.S. Patent Application Publication No. 2014/0214631;
U.S. Patent Application Publication No. 2014/0217166;
U.S. Patent Application Publication No. 2014/0217180;
U.S. Patent Application Publication No. 2014/0231500;
U.S. Patent Application Publication No. 2014/0232930;
U.S. Patent Application Publication No. 2014/0247315;
U.S. Patent Application Publication No. 2014/0263493;
U.S. Patent Application Publication No. 2014/0263645;
U.S. Patent Application Publication No. 2014/0267609;
U.S. Patent Application Publication No. 2014/0270196;
U.S. Patent Application Publication No. 2014/0270229;
U.S. Patent Application Publication No. 2014/0278387;
U.S. Patent Application Publication No. 2014/0278391;
U.S. Patent Application Publication No. 2014/0282210;
U.S. Patent Application Publication No. 2014/0284384;
U.S. Patent Application Publication No. 2014/0288933;
U.S. Patent Application Publication No. 2014/0297058;
U.S. Patent Application Publication No. 2014/0299665;
U.S. Patent Application Publication No. 2014/0312121;
U.S. Patent Application Publication No. 2014/0319220;
U.S. Patent Application Publication No. 2014/0319221;
U.S. Patent Application Publication No. 2014/0326787;
U.S. Patent Application Publication No. 2014/0332590;
U.S. Patent Application Publication No. 2014/0344943;
U.S. Patent Application Publication No. 2014/0346233;
U.S. Patent Application Publication No. 2014/0351317;
U.S. Patent Application Publication No. 2014/0353373;
U.S. Patent Application Publication No. 2014/0361073;
U.S. Patent Application Publication No. 2014/0361082;
U.S. Patent Application Publication No. 2014/0362184;
U.S. Patent Application Publication No. 2014/0363015;
U.S. Patent Application Publication No. 2014/0369511;
U.S. Patent Application Publication No. 2014/0374483;
U.S. Patent Application Publication No. 2014/0374485;
U.S. Patent Application Publication No. 2015/0001301;
U.S. Patent Application Publication No. 2015/0001304;
U.S. Patent Application Publication No. 2015/0003673;
U.S. Patent Application Publication No. 2015/0009338;
U.S. Patent Application Publication No. 2015/0009610;
U.S. Patent Application Publication No. 2015/0014416;
U.S. Patent Application Publication No. 2015/0021397;
U.S. Patent Application Publication No. 2015/0028102;
U.S. Patent Application Publication No. 2015/0028103;
U.S. Patent Application Publication No. 2015/0028104;
U.S. Patent Application Publication No. 2015/0029002;
U.S. Patent Application Publication No. 2015/0032709;
U.S. Patent Application Publication No. 2015/0039309;
U.S. Patent Application Publication No. 2015/0039878;
U.S. Patent Application Publication No. 2015/0040378;
U.S. Patent Application Publication No. 2015/0048168;
U.S. Patent Application Publication No. 2015/0049347;
U.S. Patent Application Publication No. 2015/0051992;
U.S. Patent Application Publication No. 2015/0053766;
U.S. Patent Application Publication No. 2015/0053768;
U.S. Patent Application Publication No. 2015/0053769;
U.S. Patent Application Publication No. 2015/0060544;
U.S. Patent Application Publication No. 2015/0062366;
U.S. Patent Application Publication No. 2015/0063215;
U.S. Patent Application Publication No. 2015/0063676;
U.S. Patent Application Publication No. 2015/0069130;
U.S. Patent Application Publication No. 2015/0071819;
U.S. Patent Application Publication No. 2015/0083800;
U.S. Patent Application Publication No. 2015/0086114;
U.S. Patent Application Publication No. 2015/0088522;
U.S. Patent Application Publication No. 2015/0096872;
U.S. Patent Application Publication No. 2015/0099557;
U.S. Patent Application Publication No. 2015/0100196;
U.S. Patent Application Publication No. 2015/0102109;
U.S. Patent Application Publication No. 2015/0115035;
U.S. Patent Application Publication No. 2015/0127791;
U.S. Patent Application Publication No. 2015/0128116;
U.S. Patent Application Publication No. 2015/0129659;
U.S. Patent Application Publication No. 2015/0133047;
U.S. Patent Application Publication No. 2015/0134470;
U.S. Patent Application Publication No. 2015/0136851;
U.S. Patent Application Publication No. 2015/0136854;
U.S. Patent Application Publication No. 2015/0142492;
U.S. Patent Application Publication No. 2015/0144692;
U.S. Patent Application Publication No. 2015/0144698;
U.S. Patent Application Publication No. 2015/0144701;
U.S. Patent Application Publication No. 2015/0149946;
U.S. Patent Application Publication No. 2015/0161429;
U.S. Patent Application Publication No. 2015/0169925;
U.S. Patent Application Publication No. 2015/0169929;
U.S. Patent Application Publication No. 2015/0178523;
U.S. Patent Application Publication No. 2015/0178534;
U.S. Patent Application Publication No. 2015/0178535;
U.S. Patent Application Publication No. 2015/0178536;
U.S. Patent Application Publication No. 2015/0178537;
U.S. Patent Application Publication No. 2015/0181093;
U.S. Patent Application Publication No. 2015/0181109;
U.S. patent application Ser. No. 13/367,978 for a Laser Scanning Module Employing an Elastomeric U-Hinge Based Laser Scanning Assembly, filed Feb. 7, 2012 (Feng et al.);
U.S. patent application Ser. No. 29/458,405 for an Electronic Device, filed Jun. 19, 2013 (Fitch et al.);
U.S. patent application Ser. No. 29/459,620 for an Electronic Device Enclosure, filed Jul. 2, 2013 (London et al.);
U.S. patent application Ser. No. 29/468,118 for an Electronic Device Case, filed Sep. 26, 2013 (Oberpriller et al.);

U.S. patent application Ser. No. 14/150,393 for Indicia-reader Having Unitary Construction Scanner, filed Jan. 8, 2014 (Colavito et al.);

U.S. patent application Ser. No. 14/200,405 for Indicia Reader for Size-Limited Applications filed Mar. 7, 2014 (Feng et al.);

U.S. patent application Ser. No. 14/231,898 for Hand-Mounted Indicia-Reading Device with Finger Motion Triggering filed Apr. 1, 2014 (Van Horn et al.);

U.S. patent application Ser. No. 29/486,759 for an Imaging Terminal, filed Apr. 2, 2014 (Oberpriller et al.);

U.S. patent application Ser. No. 14/257,364 for Docking System and Method Using Near Field Communication filed Apr. 21, 2014 (Showering);

U.S. patent application Ser. No. 14/264,173 for Autofocus Lens System for Indicia Readers filed Apr. 29, 2014 (Ackley et al.);

U.S. patent application Ser. No. 14/277,337 for MULTIPURPOSE OPTICAL READER, filed May 14, 2014 (Jovanovski et al.);

U.S. patent application Ser. No. 14/283,282 for TERMINAL HAVING ILLUMINATION AND FOCUS CONTROL filed May 21, 2014 (Liu et al.);

U.S. patent application Ser. No. 14/327,827 for a MOBILE-PHONE ADAPTER FOR ELECTRONIC TRANSACTIONS, filed Jul. 10, 2014 (Hejl);

U.S. patent application Ser. No. 14/334,934 for a SYSTEM AND METHOD FOR INDICIA VERIFICATION, filed Jul. 18, 2014 (Hejl);

U.S. patent application Ser. No. 14/339,708 for LASER SCANNING CODE SYMBOL READING SYSTEM, filed Jul. 24, 2014 (Xian et al.);

U.S. patent application Ser. No. 14/340,627 for an AXIALLY REINFORCED FLEXIBLE SCAN ELEMENT, filed Jul. 25, 2014 (Rueblinger et al.);

U.S. patent application Ser. No. 14/446,391 for MULTIFUNCTION POINT OF SALE APPARATUS WITH OPTICAL SIGNATURE CAPTURE filed Jul. 30, 2014 (Good et al.);

U.S. patent application Ser. No. 14/452,697 for INTERACTIVE INDICIA READER, filed Aug. 6, 2014 (Todeschini);

U.S. patent application Ser. No. 14/453,019 for DIMENSIONING SYSTEM WITH GUIDED ALIGNMENT, filed Aug. 6, 2014 (Li et al.);

U.S. patent application Ser. No. 14/462,801 for MOBILE COMPUTING DEVICE WITH DATA COGNITION SOFTWARE, filed on Aug. 19, 2014 (Todeschini et al.);

U.S. patent application Ser. No. 14/483,056 for VARIABLE DEPTH OF FIELD BARCODE SCANNER filed Sep. 10, 2014 (McCloskey et al.);

U.S. patent application Ser. No. 14/513,808 for IDENTIFYING INVENTORY ITEMS IN A STORAGE FACILITY filed Oct. 14, 2014 (Singel et al.);

U.S. patent application Ser. No. 14/519,195 for HANDHELD DIMENSIONING SYSTEM WITH FEEDBACK filed Oct. 21, 2014 (Laffargue et al.);

U.S. patent application Ser. No. 14/519,179 for DIMENSIONING SYSTEM WITH MULTIPATH INTERFERENCE MITIGATION filed Oct. 21, 2014 (Thuries et al.);

U.S. patent application Ser. No. 14/519,211 for SYSTEM AND METHOD FOR DIMENSIONING filed Oct. 21, 2014 (Ackley et al.);

U.S. patent application Ser. No. 14/519,233 for HANDHELD DIMENSIONER WITH DATA-QUALITY INDICATION filed Oct. 21, 2014 (Laffargue et al.);

U.S. patent application Ser. No. 14/519,249 for HANDHELD DIMENSIONING SYSTEM WITH MEASUREMENT-CONFORMANCE FEEDBACK filed Oct. 21, 2014 (Ackley et al.);

U.S. patent application Ser. No. 14/527,191 for METHOD AND SYSTEM FOR RECOGNIZING SPEECH USING WILDCARDS IN AN EXPECTED RESPONSE filed Oct. 29, 2014 (Braho et al.);

U.S. patent application Ser. No. 14/529,563 for ADAPTABLE INTERFACE FOR A MOBILE COMPUTING DEVICE filed Oct. 31, 2014 (Schoon et al.);

U.S. patent application Ser. No. 14/529,857 for BARCODE READER WITH SECURITY FEATURES filed Oct. 31, 2014 (Todeschini et al.);

U.S. patent application Ser. No. 14/398,542 for PORTABLE ELECTRONIC DEVICES HAVING A SEPARATE LOCATION TRIGGER UNIT FOR USE IN CONTROLLING AN APPLICATION UNIT filed Nov. 3, 2014 (Bian et al.);

U.S. patent application Ser. No. 14/531,154 for DIRECTING AN INSPECTOR THROUGH AN INSPECTION filed Nov. 3, 2014 (Miller et al.);

U.S. patent application Ser. No. 14/533,319 for BARCODE SCANNING SYSTEM USING WEARABLE DEVICE WITH EMBEDDED CAMERA filed Nov. 5, 2014 (Todeschini);

U.S. patent application Ser. No. 14/535,764 for CONCATENATED EXPECTED RESPONSES FOR SPEECH RECOGNITION filed Nov. 7, 2014 (Braho et al.);

U.S. patent application Ser. No. 14/568,305 for AUTO-CONTRAST VIEWFINDER FOR AN INDICIA READER filed Dec. 12, 2014 (Todeschini);

U.S. patent application Ser. No. 14/573,022 for DYNAMIC DIAGNOSTIC INDICATOR GENERATION filed Dec. 17, 2014 (Goldsmith);

U.S. patent application Ser. No. 14/578,627 for SAFETY SYSTEM AND METHOD filed Dec. 22, 2014 (Ackley et al.);

U.S. patent application Ser. No. 14/580,262 for MEDIA GATE FOR THERMAL TRANSFER PRINTERS filed Dec. 23, 2014 (Bowles);

U.S. patent application Ser. No. 14/590,024 for SHELVING AND PACKAGE LOCATING SYSTEMS FOR DELIVERY VEHICLES filed Jan. 6, 2015 (Payne);

U.S. patent application Ser. No. 14/596,757 for SYSTEM AND METHOD FOR DETECTING BARCODE PRINTING ERRORS filed Jan. 14, 2015 (Ackley);

U.S. patent application Ser. No. 14/416,147 for OPTICAL READING APPARATUS HAVING VARIABLE SETTINGS filed Jan. 21, 2015 (Chen et al.);

U.S. patent application Ser. No. 14/614,706 for DEVICE FOR SUPPORTING AN ELECTRONIC TOOL ON A USER'S HAND filed Feb. 5, 2015 (Oberpriller et al.);

U.S. patent application Ser. No. 14/614,796 for CARGO APPORTIONMENT TECHNIQUES filed Feb. 5, 2015 (Morton et al.);

U.S. patent application Ser. No. 29/516,892 for TABLE COMPUTER filed Feb. 6, 2015 (Bidwell et al.);

U.S. patent application Ser. No. 14/619,093 for METHODS FOR TRAINING A SPEECH RECOGNITION SYSTEM filed Feb. 11, 2015 (Pecorari);

U.S. patent application Ser. No. 14/628,708 for DEVICE, SYSTEM, AND METHOD FOR DETERMINING THE STATUS OF CHECKOUT LANES filed Feb. 23, 2015 (Todeschini);

U.S. patent application Ser. No. 14/630,841 for TERMINAL INCLUDING IMAGING ASSEMBLY filed Feb. 25, 2015 (Gomez et al.);

U.S. patent application Ser. No. 14/635,346 for SYSTEM AND METHOD FOR RELIABLE STORE-AND-FORWARD DATA HANDLING BY ENCODED INFORMATION READING TERMINALS filed Mar. 2, 2015 (Sevier);

U.S. patent application Ser. No. 29/519,017 for SCANNER filed Mar. 2, 2015 (Zhou et al.);

U.S. patent application Ser. No. 14/405,278 for DESIGN PATTERN FOR SECURE STORE filed Mar. 9, 2015 (Zhu et al.);

U.S. patent application Ser. No. 14/660,970 for DECODABLE INDICIA READING TERMINAL WITH COMBINED ILLUMINATION filed Mar. 18, 2015 (Kearney et al.);

U.S. patent application Ser. No. 14/661,013 for REPROGRAMMING SYSTEM AND METHOD FOR DEVICES INCLUDING PROGRAMMING SYMBOL filed Mar. 18, 2015 (Soule et al.);

U.S. patent application Ser. No. 14/662,922 for MULTIFUNCTION POINT OF SALE SYSTEM filed Mar. 19, 2015 (Van Horn et al.);

U.S. patent application Ser. No. 14/663,638 for VEHICLE MOUNT COMPUTER WITH CONFIGURABLE IGNITION SWITCH BEHAVIOR filed Mar. 20, 2015 (Davis et al.);

U.S. patent application Ser. No. 14/664,063 for METHOD AND APPLICATION FOR SCANNING A BARCODE WITH A SMART DEVICE WHILE CONTINUOUSLY RUNNING AND DISPLAYING AN APPLICATION ON THE SMART DEVICE DISPLAY filed Mar. 20, 2015 (Todeschini);

U.S. patent application Ser. No. 14/669,280 for TRANSFORMING COMPONENTS OF A WEB PAGE TO VOICE PROMPTS filed Mar. 26, 2015 (Funyak et al.);

U.S. patent application Ser. No. 14/674,329 for AIMER FOR BARCODE SCANNING filed Mar. 31, 2015 (Bidwell);

U.S. patent application Ser. No. 14/676,109 for INDICIA READER filed Apr. 1, 2015 (Huck);

U.S. patent application Ser. No. 14/676,327 for DEVICE MANAGEMENT PROXY FOR SECURE DEVICES filed Apr. 1, 2015 (Yeakley et al.);

U.S. patent application Ser. No. 14/676,898 for NAVIGATION SYSTEM CONFIGURED TO INTEGRATE MOTION SENSING DEVICE INPUTS filed Apr. 2, 2015 (Showering);

U.S. patent application Ser. No. 14/679,275 for DIMENSIONING SYSTEM CALIBRATION SYSTEMS AND METHODS filed Apr. 6, 2015 (Laffargue et al.);

U.S. patent application Ser. No. 29/523,098 for HANDLE FOR A TABLET COMPUTER filed Apr. 7, 2015 (Bidwell et al.);

U.S. patent application Ser. No. 14/682,615 for SYSTEM AND METHOD FOR POWER MANAGEMENT OF MOBILE DEVICES filed Apr. 9, 2015 (Murawski et al.);

U.S. patent application Ser. No. 14/686,822 for MULTIPLE PLATFORM SUPPORT SYSTEM AND METHOD filed Apr. 15, 2015 (Qu et al.);

U.S. patent application Ser. No. 14/687,289 for SYSTEM FOR COMMUNICATION VIA A PERIPHERAL HUB filed Apr. 15, 2015 (Kohtz et al.);

U.S. patent application Ser. No. 29/524,186 for SCANNER filed Apr. 17, 2015 (Zhou et al.);

U.S. patent application Ser. No. 14/695,364 for MEDICATION MANAGEMENT SYSTEM filed Apr. 24, 2015 (Sewell et al.);

U.S. patent application Ser. No. 14/695,923 for SECURE UNATTENDED NETWORK AUTHENTICATION filed Apr. 24, 2015 (Kubler et al.);

U.S. patent application Ser. No. 29/525,068 for TABLET COMPUTER WITH REMOVABLE SCANNING DEVICE filed Apr. 27, 2015 (Schulte et al.);

U.S. patent application Ser. No. 14/699,436 for SYMBOL READING SYSTEM HAVING PREDICTIVE DIAGNOSTICS filed Apr. 29, 2015 (Nahill et al.);

U.S. patent application Ser. No. 14/702,110 for SYSTEM AND METHOD FOR REGULATING BARCODE DATA INJECTION INTO A RUNNING APPLICATION ON A SMART DEVICE filed May 1, 2015 (Todeschini et al.);

U.S. patent application Ser. No. 14/702,979 for TRACKING BATTERY CONDITIONS filed May 4, 2015 (Young et al.);

U.S. patent application Ser. No. 14/704,050 for INTERMEDIATE LINEAR POSITIONING filed May 5, 2015 (Charpentier et al.);

U.S. patent application Ser. No. 14/705,012 for HANDS-FREE HUMAN MACHINE INTERFACE RESPONSIVE TO A DRIVER OF A VEHICLE filed May 6, 2015 (Fitch et al.);

U.S. patent application Ser. No. 14/705,407 for METHOD AND SYSTEM TO PROTECT SOFTWARE-BASED NETWORK-CONNECTED DEVICES FROM ADVANCED PERSISTENT THREAT filed May 6, 2015 (Hussey et al.);

U.S. patent application Ser. No. 14/707,037 for SYSTEM AND METHOD FOR DISPLAY OF INFORMATION USING A VEHICLE-MOUNT COMPUTER filed May 8, 2015 (Chamberlin);

U.S. patent application Ser. No. 14/707,123 for APPLICATION INDEPENDENT DEX/UCS INTERFACE filed May 8, 2015 (Pape);

U.S. patent application Ser. No. 14/707,492 for METHOD AND APPARATUS FOR READING OPTICAL INDICIA USING A PLURALITY OF DATA SOURCES filed May 8, 2015 (Smith et al.);

U.S. patent application Ser. No. 14/710,666 for PRE-PAID USAGE SYSTEM FOR ENCODED INFORMATION READING TERMINALS filed May 13, 2015 (Smith);

U.S. patent application Ser. No. 29/526,918 for CHARGING BASE filed May 14, 2015 (Fitch et al.);

U.S. patent application Ser. No. 14/715,672 for AUGUMENTED REALITY ENABLED HAZARD DISPLAY filed May 19, 2015 (Venkatesha et al.);

U.S. patent application Ser. No. 14/715,916 for EVALUATING IMAGE VALUES filed May 19, 2015 (Ackley);

U.S. patent application Ser. No. 14/722,608 for INTERACTIVE USER INTERFACE FOR CAPTURING A DOCUMENT IN AN IMAGE SIGNAL filed May 27, 2015 (Showering et al.);

U.S. patent application Ser. No. 29/528,165 for IN-COUNTER BARCODE SCANNER filed May 27, 2015 (Oberpriller et al.);

U.S. patent application Ser. No. 14/724,134 for ELECTRONIC DEVICE WITH WIRELESS PATH SELECTION CAPABILITY filed May 28, 2015 (Wang et al.);

U.S. patent application Ser. No. 14/724,849 for METHOD OF PROGRAMMING THE DEFAULT CABLE INTERFACE SOFTWARE IN AN INDICIA READING DEVICE filed May 29, 2015 (Barten);

U.S. patent application Ser. No. 14/724,908 for IMAGING APPARATUS HAVING IMAGING ASSEMBLY filed May 29, 2015 (Barber et al.);

U.S. patent application Ser. No. 14/725,352 for APPARATUS AND METHODS FOR MONITORING ONE OR MORE PORTABLE DATA TERMINALS (Caballero et al.);

U.S. patent application Ser. No. 29/528,590 for ELECTRONIC DEVICE filed May 29, 2015 (Fitch et al.);

U.S. patent application Ser. No. 29/528,890 for MOBILE COMPUTER HOUSING filed Jun. 2, 2015 (Fitch et al.);

U.S. patent application Ser. No. 14/728,397 for DEVICE MANAGEMENT USING VIRTUAL INTERFACES CROSS-REFERENCE TO RELATED APPLICATIONS filed Jun. 2, 2015 (Caballero);

U.S. patent application Ser. No. 14/732,870 for DATA COLLECTION MODULE AND SYSTEM filed Jun. 8, 2015 (Powilleit);

U.S. patent application Ser. No. 29/529,441 for INDICIA READING DEVICE filed Jun. 8, 2015 (Zhou et al.);

U.S. patent application Ser. No. 14/735,717 for INDICIA-READING SYSTEMS HAVING AN INTERFACE WITH A USER'S NERVOUS SYSTEM filed Jun. 10, 2015 (Todeschini);

U.S. patent application Ser. No. 14/738,038 for METHOD OF AND SYSTEM FOR DETECTING OBJECT WEIGHING INTERFERENCES filed Jun. 12, 2015 (Amundsen et al.);

U.S. patent application Ser. No. 14/740,320 for TACTILE SWITCH FOR A MOBILE ELECTRONIC DEVICE filed Jun. 16, 2015 (Bandringa);

U.S. patent application Ser. No. 14/740,373 for CALIBRATING A VOLUME DIMENSIONER filed Jun. 16, 2015 (Ackley et al.);

U.S. patent application Ser. No. 14/742,818 for INDICIA READING SYSTEM EMPLOYING DIGITAL GAIN CONTROL filed Jun. 18, 2015 (Xian et al.);

U.S. patent application Ser. No. 14/743,257 for WIRELESS MESH POINT PORTABLE DATA TERMINAL filed Jun. 18, 2015 (Wang et al.);

U.S. patent application Ser. No. 29/530,600 for CYCLONE filed Jun. 18, 2015 (Vargo et al);

U.S. patent application Ser. No. 14/744,633 for IMAGING APPARATUS COMPRISING IMAGE SENSOR ARRAY HAVING SHARED GLOBAL SHUTTER CIRCUITRY filed Jun. 19, 2015 (Wang);

U.S. patent application Ser. No. 14/744,836 for CLOUD-BASED SYSTEM FOR READING OF DECODABLE INDICIA filed Jun. 19, 2015 (Todeschini et al.);

U.S. patent application Ser. No. 14/745,006 for SELECTIVE OUTPUT OF DECODED MESSAGE DATA filed Jun. 19, 2015 (Todeschini et al.);

U.S. patent application Ser. No. 14/747,197 for OPTICAL PATTERN PROJECTOR filed Jun. 23, 2015 (Thuries et al.);

U.S. patent application Ser. No. 14/747,490 for DUAL-PROJECTOR THREE-DIMENSIONAL SCANNER filed Jun. 23, 2015 (Jovanovski et al.); and U.S. patent application Ser. No. 14/748,446 for CORDLESS INDICIA READER WITH A MULTIFUNCTION COIL FOR WIRELESS CHARGING AND EAS DEACTIVATION, filed Jun. 24, 2015 (Xie et al.).

In the specification and/or figures, typical embodiments of the invention have been disclosed. The present invention is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

The invention claimed is:

1. A sealing assembly comprising:
a peripheral side wall at least partially surrounding a frame of an electronic device;
a seal element formed at least partially on an outside surface of the peripheral side wall, the seal element having a first component and a second component, wherein the first component and second component are extensions of the seal element;
a top section having a lower wall, wherein the first component of the seal element is configured to be compressed by the lower wall to constrain the top section in a lower position; and
a bottom section having an upper wall, wherein the second component of the seal element is configured to be compressed by the upper wall to constrain the bottom section in an upper position;
wherein the seal element is configured to seal a gap between the top section and the bottom section.

2. The sealing assembly of claim 1, wherein the lower wall of the top section is configured to be held in contact with the upper wall of the bottom section.

3. The sealing assembly of claim 1, wherein the seal element is over-molded on the peripheral side wall.

4. The sealing assembly of claim 1, wherein a first vertical portion of the seal element applies a first force in a first direction to a first vertical portion of the lower wall of the top section and applies a second force in a second direction to a first vertical portion of the upper wall of the bottom section, wherein the first direction is substantially opposite to the second direction, and wherein the first and second directions are substantially perpendicular to a plane defining the frame of the electronic device.

5. The sealing assembly of claim 4, wherein a second vertical portion of the seal element applies a third force in a third direction to a second vertical portion of the lower wall of the top section and applies a fourth force in a fourth direction to a second vertical portion of the upper wall of the bottom section, and wherein the third direction and fourth direction are oriented at acute angles with respect to the first and second directions.

6. The sealing assembly of claim 5, wherein the third direction is substantially opposite to the fourth direction.

7. The sealing assembly of claim 1, wherein a lower rim of the upper wall section and an upper rim of the lower wall section have varying elevations.

8. The sealing assembly of claim 1, wherein a lower rim of the upper wall section has a non-uniform edge that is compatible with a non-uniform edge of an upper rim of the lower wall section.

9. The sealing assembly of claim 1, wherein the seal element comprises a thermoplastic elastomer.

10. The sealing assembly of claim 1, wherein the electronic device is a mobile thermal printer.

11. A sealing assembly comprising:
a peripheral side wall at least partially surrounding a frame of an electronic device;
a seal element formed at least partially on an outside surface of the peripheral side wall, the seal element having a first component and a second component;
a top section having a lower wall, wherein the first component of the seal element is configured to be compressed by the lower wall to constrain the top section in a lower position; and
a bottom section having an upper wall, wherein the second component of the seal element is configured to be compressed by the upper wall to constrain the bottom section in an upper position,
wherein the seal element is configured to seal a gap between the top section and the bottom section,
wherein a first vertical portion of the seal element applies a first force in a first direction to a first vertical portion of the lower wall of the top section and applies a second force in a second direction to a first vertical portion of the upper wall of the bottom section, wherein the first direction is substantially opposite to the second direction, and wherein the first and second directions are substantially perpendicular to a plane defining the frame of the electronic device.

12. The sealing assembly of claim 11, wherein the lower wall of the top section is configured to be held in contact with the upper wall of the bottom section.

13. The sealing assembly of claim 11, wherein a second vertical portion of the seal element applies a third force in a third direction to a second vertical portion of the lower wall of the top section and applies a fourth force in a fourth direction to a second vertical portion of the upper wall of the bottom section, and wherein the third direction and fourth direction are oriented at acute angles with respect to the first and second directions.

14. The sealing assembly of claim 13, wherein the third direction is substantially opposite to the fourth direction.

15. The sealing assembly of claim 11, wherein a lower rim of the upper wall section has a non-uniform edge that is compatible with a non-uniform edge of an upper rim of the lower wall section.

16. The sealing assembly of claim 11, wherein the seal element comprises a thermoplastic elastomer.

17. A sealing assembly comprising:
a peripheral side wall at least partially surrounding a frame of an electronic device;
a seal element formed at least partially on an outside surface of the peripheral side wall, the seal element having a first component and a second component;
a top section having a lower wall, wherein the first component of the seal element is configured to be compressed by the lower wall to constrain the top section in a lower position; and
a bottom section having an upper wall, wherein the second component of the seal element is configured to be compressed by the upper wall to constrain the bottom section in an upper position,
wherein the seal element is configured to seal a gap between the top section and the bottom section,
wherein a first vertical portion of the seal element applies a first force in a first direction to a first vertical portion of the lower wall of the top section and applies a second force in a second direction to a first vertical portion of the upper wall of the bottom section, wherein the first direction is substantially opposite to the second direction, and wherein the first and second directions are substantially perpendicular to a plane defining the frame of the electronic device,
wherein a second vertical portion of the seal element applies a third force in a third direction to a second vertical portion of the lower wall of the top section and applies a fourth force in a fourth direction to a second vertical portion of the upper wall of the bottom section, and wherein the third direction and fourth direction are oriented at acute angles with respect to the first and second directions.

18. The sealing assembly of claim 17, wherein the third direction is substantially opposite to the fourth direction.

19. The sealing assembly of claim 17, wherein a lower rim of the upper wall section has a non-uniform edge that is compatible with a non-uniform edge of an upper rim of the lower wall section.

20. The sealing assembly of claim 17, wherein the electronic device is a mobile thermal printer.

* * * * *